United States Patent
Shin et al.

(10) Patent No.: US 11,940,846 B2
(45) Date of Patent: *Mar. 26, 2024

(54) DISPLAY DEVICE

(71) Applicant: Samsung Display Co., LTD., Yongin-si (KR)

(72) Inventors: Jai Ku Shin, Hwaseong-si (KR); Dong Jin Park, Seongnam-si (KR); Dong Woo Seo, Suwon-si (KR); Sung Chul Choi, Hwaseong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/137,408

(22) Filed: Apr. 20, 2023

(65) Prior Publication Data

US 2023/0251690 A1    Aug. 10, 2023

Related U.S. Application Data

(63) Continuation of application No. 17/193,841, filed on Mar. 5, 2021, now Pat. No. 11,656,656.

(30) Foreign Application Priority Data

May 26, 2020    (KR) .................. 10-2020-0063087

(51) Int. Cl.
*G06F 1/16*    (2006.01)
*G06F 1/20*    (2006.01)
*H05K 7/20*    (2006.01)

(52) U.S. Cl.
CPC ............ *G06F 1/1652* (2013.01); *G06F 1/203* (2013.01); *H05K 7/20963* (2013.01)

(58) Field of Classification Search
CPC .... G06F 1/1652; G06F 1/203; H05K 7/20963
See application file for complete search history.

(56) References Cited

U.S. PATENT DOCUMENTS 9,246,131 B2    1/2016    Thoumazet et al.
9,731,477 B1    8/2017    Menon et al.
(Continued)

FOREIGN PATENT DOCUMENTS

KR    1020190080740 A    7/2019
KR    1020190081281 A    7/2019
(Continued)

*Primary Examiner* — Michael A Matey
(74) *Attorney, Agent, or Firm* — CANTOR COLBURN LLP

(57) ABSTRACT

A display device includes a display panel including a rear surface and a front surface, where the front surface is provided with a display surface and including a folding axis extending in a first direction, a first barrier member disposed on the rear surface of the display panel and having a modulus of about 1 GPa to about 300 GPa, a first coupling member disposed on a rear surface of the first barrier member, and a metal plate disposed on a rear surface of the first coupling member and including a first plate portion and a second plate portion which are arranged in a second direction crossing the first direction and a connection portion connecting the first plate portion and the second plate portion, where the first coupling member does not overlap the connection portion in a plan view.

20 Claims, 15 Drawing Sheets

(56) References Cited

U.S. PATENT DOCUMENTS

| | | | |
|---|---|---|---|
| 9,995,831 B2 | 6/2018 | Verschuren et al. | |
| 10,707,441 B2 * | 7/2020 | Kwon | H10K 71/00 |
| 2011/0177261 A1 | 7/2011 | Ishii et al. | |
| 2018/0150108 A1 | 5/2018 | Song | |
| 2018/0175310 A1 | 6/2018 | Lee et al. | |
| 2018/0198096 A1 | 7/2018 | Yasuda et al. | |
| 2018/0284934 A1 | 10/2018 | Wu et al. | |
| 2019/0130796 A1 * | 5/2019 | Kang | H10K 50/87 |
| 2019/0140197 A1 | 5/2019 | Zhao | |
| 2019/0196548 A1 | 6/2019 | Kim et al. | |
| 2019/0334114 A1 | 10/2019 | Park | |
| 2019/0346887 A1 | 11/2019 | Park et al. | |
| 2020/0051881 A1 | 2/2020 | Park et al. | |
| 2021/0108077 A1 | 4/2021 | Berleue et al. | |
| 2021/0118337 A1 | 4/2021 | Park et al. | |
| 2021/0259119 A1 | 8/2021 | Seo et al. | |
| 2022/0322583 A1 * | 10/2022 | Shin | G06F 1/1652 |

FOREIGN PATENT DOCUMENTS

| | | |
|---|---|---|
| KR | 1020190082339 A | 7/2019 |
| KR | 1020190124844 A | 11/2019 |
| KR | 1020210104508 | 8/2021 |

\* cited by examiner

DISPLAY DEVICE

This application is a continuation of U.S. patent application Ser. No. 17/193,841, filed on Mar. 5, 2021, which claims priority to Korean Patent Application No. 10-2020-0063087 filed on May 26, 2020, and all the benefits accruing therefrom under 35 U.S.C. § 119, the content of which in its entirety is herein incorporated by reference.

BACKGROUND

1. Field of the Invention

The disclosure relates to a display device.

2. Description of the Related Art

A display device, which is a device for displaying an image, includes a display panel such as an organic light emitting display panel including organic light emitting diodes ("OLED") or quantum dot electroluminescence elements ("QD-EL"), or a liquid crystal display panel.

A mobile electronic appliance includes a display device to provide an image to a user. The proportion of mobile electronic appliances having the same or smaller volume or thickness and having a larger display screen than conventional electronic appliances has increased. Further, in order to provide a larger screen only when used, foldable display devices or bendable display devices having a structure capable of being folded and unfolded have also been developed.

In such display devices, a metal plate configured to be stretched at least partially in response to the folding of a display panel may be disposed on the rear surface of the display panel.

In order to facilitate the folding of the display device, the metal plate is provided with a connection portion corresponding to a folding area. However, the shape of a lattice pattern constituting the connection portion may be viewed on the display surface of the display device, thereby deteriorating display quality.

SUMMARY

An aspect of the disclosure is to provide a display device capable of preventing the connection portion of the metal plate from being viewed from outside the display device.

Another aspect of the disclosure is to provide a display device capable of improving impact resistance when the display device is folded.

However, aspects of the disclosure are not restricted to the one set forth herein.

The above and other aspects of the disclosure will become more apparent to one of ordinary skill in the art to which the disclosure pertains by referencing the detailed description of the disclosure given below.

According to an embodiment of the disclosure, a display device includes a display panel including a rear surface and a front surface, where the front surface is provided with a display surface and including a folding axis extending in a first direction; a first barrier member disposed on the rear surface of the display panel and having a modulus of about 1 gigapascals (GPa) to about 300 GPa; a first coupling member disposed on a rear surface of the first barrier member; and a metal plate disposed on a rear surface of the first coupling member and including a first plate portion and a second plate portion which are arranged in a second direction crossing the first direction and a connection portion connecting the first plate portion and the second plate portion, where the first coupling member does not overlap the connection portion in a plan view.

In an embodiment, the first barrier member may have the modulus of about 1 GPa to about 10 GPa.

In an embodiment, the first barrier member may have a thickness of about 25 micrometers ($\mu$m) to about 80 $\mu$m.

In an embodiment, the first barrier member may include at least one selected from polyimide, polyacrylate, polymethyl methacrylate, polycarbonate, polyethylene terephthalate, polyethylene naphthalate, polyether sulfone, and a cycloolefin copolymer.

In an embodiment, the first barrier member may have the modulus of about 10 GPa to about 300 GPa.

In an embodiment, the first barrier member may have a thickness of about 10 $\mu$m to about 50 $\mu$m.

In an embodiment, the first barrier member may include at least one selected from steel used stainless ("SUS"), invar, aluminum, iron, chromium, carbon, nickel, silicon, manganese, and molybdenum.

In an embodiment, the first coupling member may include a first coupling portion overlapping the first plate portion and a second coupling portion spaced apart from the first coupling portion and overlapping the second plate portion in the plan view.

In an embodiment, the first coupling portion and the second coupling portion may be spaced apart from each other by a first spacing interval, and a width of the first spacing interval may be equal to or greater than a width of the connection portion in the second direction.

In an embodiment, the display device may further include a second coupling member disposed between the display panel and the first barrier member, where a sum of a thickness of the first coupling member and a thickness of the second coupling member may be greater than about 1 $\mu$m and equal to or less than about 80 $\mu$m.

In an embodiment, the thickness of the second coupling member may be about 1 $\mu$m and about 50 $\mu$m.

In an embodiment, the display device may further include a third coupling member disposed on a rear surface of the metal plate, a second barrier member disposed on a rear surface of the third coupling member, a fourth coupling member disposed on a rear surface of the second barrier member, and a heat dissipation member disposed on a rear surface of the fourth coupling member.

In an embodiment, the second barrier member may overlap the first plate portion, the second plate portion, and the connection portion in the plan view.

In an embodiment, the heat dissipation member may include a first heat dissipation portion overlapping the first plate portion and a second heat dissipation portion spaced apart from the first heat dissipation portion and overlapping the second plate portion in the plan view.

In an embodiment, a second spacing interval between the first heat dissipation portion and the second heat dissipation portion may overlap the connection portion in the plan view.

In an embodiment, the fourth coupling member may include a third coupling portion overlapping the first plate portion and a fourth coupling portion spaced apart from the third coupling portion and overlapping the second plate portion in the plan view, the third coupling portion and the fourth coupling portion may be spaced apart from each other by a third spacing interval, and the third spacing interval may be equal to or greater than a width of the connection portion.

In an embodiment, the display device may further include a fifth coupling member disposed on a rear surface of the heat dissipation member, and a cushion member disposed on a rear surface of the fifth coupling member, where the cushion member includes a first cushion portion overlapping the first plate portion and a second cushion portion spaced apart from the first cushion portion and overlapping the second plate portion in the plan view, the first cushion member and the second cushion member are spaced apart from each other by a fourth spacing interval, and the fourth spacing interval overlaps the connection portion in the plan view.

According to an embodiment of the disclosure, a display device includes a display panel including a rear surface and a front surface, where the front surface is provided with a display surface and including a folding axis extending in a first direction; a second coupling member disposed on the rear surface of the display panel; a first barrier member disposed on a rear surface of the second coupling member; a first coupling member disposed on a rear surface of the first barrier member; and a metal plate disposed on a rear surface of the first coupling member and including a first plate portion and a second plate portion which are arranged in a second direction crossing the first direction and a connection portion connecting the first plate portion and the second plate portion, where a sum of a thickness of the first coupling member and a thickness of the second coupling member is greater than about 1 $\mu m$ and equal to or less than about 80 $\mu m$.

In an embodiment, the thickness of the second coupling member may be about 1 $\mu m$ and about 50 $\mu m$.

In an embodiment, the first coupling member may not overlap the connection portion of the metal plate in a plan view.

BRIEF DESCRIPTION OF THE DRAWINGS

The above and other aspects and features of the disclosure will become more apparent by describing in detail exemplary embodiments thereof with reference to the attached drawings, in which.

DETAILED DESCRIPTION

Figure 1:
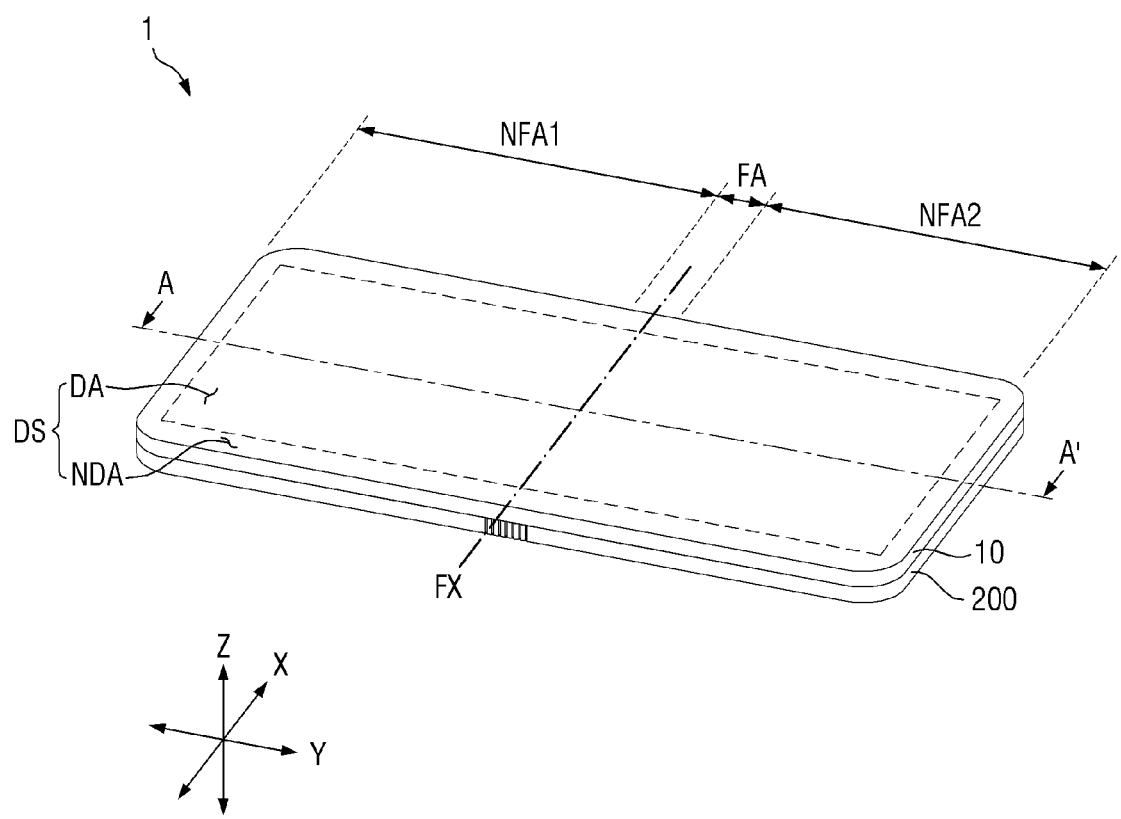
FIG. 1 is a perspective view of a display device according to an embodiment.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting 'a' or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the disclosure will be described with reference to the attached drawings.

Figure 2:
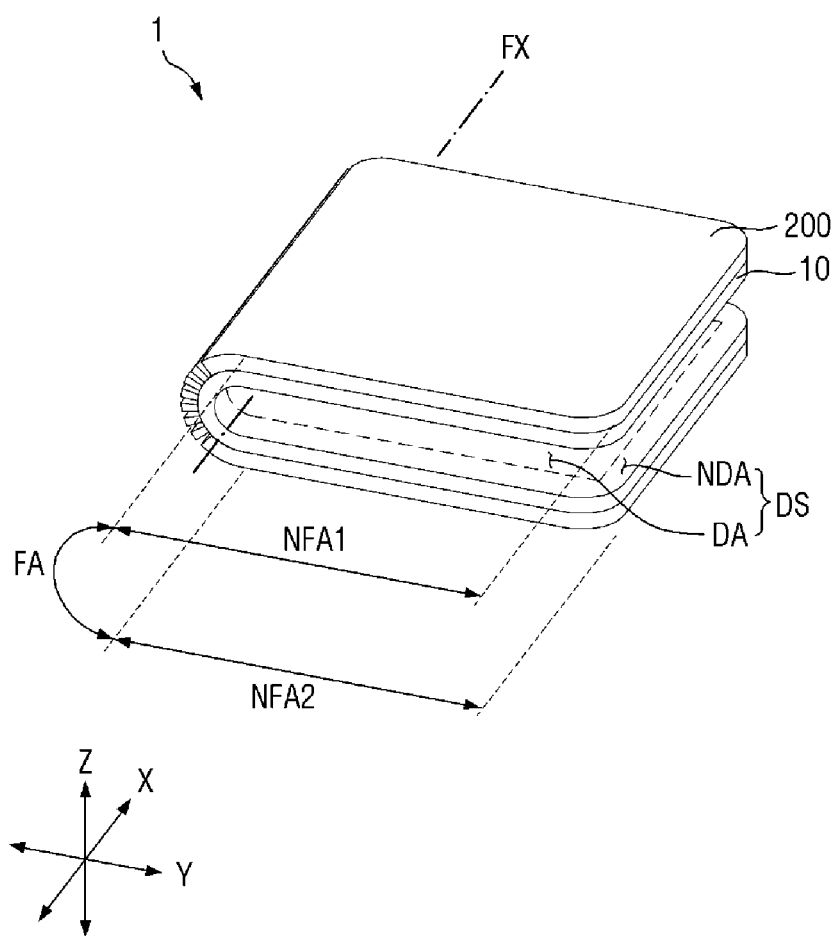
FIG. 2 is a perspective view of the display device of FIG. 1 in a folded state.

FIG. 1 is a perspective view of a display device according to an embodiment, and FIG. 2 is a perspective view of the display device of FIG. 1 in a folded state.

Although a display device 1 according to an embodiment will be described with reference to smart phones, the disclosure according to the invention is not limited thereto. For example, the display device 1 according to embodiments of the present specification may be applied to portable phones, tablet PCs, personal digital assistants ("PDAs"), portable multimedia players ("PMPs"), televisions, game machines, wrist-watch type electronic devices, head mount displays, monitors of personal computers, notebook computers, car navigators, car dashboards, digital cameras, camcorders, billboards, medical devices, inspection devices, various home appliances such as refrigerators and washing machines, and internet of thing devices, in addition to smart phones.

The first direction X, the second direction Y, and the third direction Z cross each other in different directions. The first direction X may be a length direction (i.e., vertical direction in a display screen), the second direction Y may be a width direction (i.e., horizontal direction in the display screen), and the third direction Z may be a thickness direction (i.e., a direction of a plan view). The third direction Z may include a front direction toward the upper surface of the display device 1 and a rear direction toward the lower surface of the display device 1. Accordingly, one surface of a member disposed to face the front direction may be referred to as a front surface (i.e., upper surface), and the other surface of the member disposed to face the rear direction may be referred to as a rear surface (i.e., lower surface). However, these directions should be understood as referring to relative directions, and are not limited to the above example.

Referring to FIGS. 1 and 2, the display device 1 according to an embodiment may have a rectangular shape or a square shape in a plan view. In an embodiment, the display device 1 may have a rectangular shape where corners are straight or a substantially rectangular shape where corners are round in a plan view. The display device 1 may include two short sides extended in the first direction X and two long sides extended in the second direction Y in a plan view. However, the disclosure according to the invention is not limited thereto, and the display device 1 may have various shapes.

The display device 1 may include a front surface and a rear surface. The display device 1 may further include at least one side surface between the front surface and the rear surface.

The display device 1 includes at least one display surface DS. In an embodiment, the display surface DS may be the front surface of the display device 1. The display surface DS may be disposed over a folding area FA and non-folding areas NFA1 and NFA2, which will be described later. In some embodiments, both the front and back surfaces of the display device 1 may be the display surface DS. In some embodiments, two or more surfaces of the front, back, and side surfaces of the display device 1 may be provided as the display surfaces DS.

The display surface DS may include a display area DA and a non-display area NDA.

The display area DA displays an image or video. In a plan view, the shape of the display area DA may correspond to the shape of the display device 1. For example, when the display device 1 has a rectangular shape in a plan view, the display area DA may also have rectangular shape.

The display area DA may be an area where a plurality of pixels is provided therein to display an image. The plurality of pixels may be arranged in a matrix from. Each of the plurality of pixels may have a rectangular shape, a rhombus shape, or a square shape in a plan view, but the shape thereof is not limited thereto. In another embodiment, for example, each of the plurality of pixels may have a polygonal shape, a circular shape, or an elliptic shape in addition to the rectangular shape, the rhombus shape, or the square shape in a plan view.

The non-display area NDA may be an area where no pixel is provided not to display an image. The non-display area NDA may be disposed around the display area DA. The non-display area NDA may be disposed to surround the display area DA as shown in FIG. 1, but the disclosure according to the invention is not limited thereto. In some embodiments, the display area DA may be partially surrounded by the non-display area NDA. In some embodiments, the display area DA has a rectangular shape, and the non-display area NDA may be disposed around four sides of the display area DA, but the disclosure according to the invention is not limited thereto.

In an embodiment, the display device 1 may be a foldable device. The display device 1 may be folded or unfolded. The "folded" includes "bent". Specifically, in the display device 1, a part thereof may overlap the other part thereof in a folded state, a part thereof may be bent to be inclined with respect to the other part thereof, or the entirety thereof may be flat. In an embodiment, the display device 1 may be folded such that a part thereof is inclined with respect to the other part thereof at an angle of more than 0° and less than 180°, or may be unfolded such that a part thereof is inclined with respect to the other part thereof at an angle of about 180°.

The display device 1 may be infolded and/or outfolded. The infolding means a state that a portion of the display surface DS of the display device 1 is folded to face another portion of the display surface DS thereof, and the outfolding means a state that a portion of the display surface DS of the display device 1 is folded so as not to face another portion of the display surface DS thereof. The outfolding may mean that a portion of the opposite surface of the display surface DS of the display device 1 is folded to face another portion of the opposite surface of the display surface DS thereof. In an embodiment, the display device 1 is infolded, but the disclosure according to the invention is not limited thereto.

The display device 1 may have a folded state or an unfolded state. The folded state includes a state in which the display device 1 is bent. Specifically, the folded state may be a state in which a portion of the display device 1 is bent to form an inclination with respect to another portion, and the unfolded state may be a state in which a portion of the display device 1 is disposed in parallel with another portion thereof on the same plane. Alternatively, the folded state may be a state in which the angle between a portion of the display device 1 and another portion thereof is about 0 degrees (°) or more and less than 180° and/or about more than 180° and less than 360°, and the unfolded state may be a state in which the angle between a portion of the display device 1 and the another portion thereof is about 180°. Here, a part and the another part may be non-folding areas NFA1 and NFA2 (to be described later), respectively.

The display device 1 may be divided into a folding area FA and non-folding areas NFA1 and NFA2. The folding area FA is an area that is folded or bent as the display device 1 is folded. The non-folding areas NFA1 and NFA2 are areas that are not folded or bent even when the display device 1 is folded. The non-folding areas NFA1 and NFA2 may include a first non-folding area NFA1 and a second non-folding area NFA2. In an embodiment, the first non-folding area NFA1 and the second non-folding area NFA2 are arranged in the second direction Y, and the folding area FA may be disposed between the first non-folding area NFA1 and the second non-folding area NFA2. In this embodiment, one folding area FA and two non-folding areas NFA1 and NFA2 are defined in the display device 1, but the disclosure according to the invention is not limited thereto. In some embodiments, a plurality of folding areas FA and non-folding areas NFA1 and NFA2 may be defined in the display device 1.

The display device 1 may be folded or unfolded with respect to a folding axis FX. The folding axis FX may be disposed to overlap the folding area FA in the thickness direction (i.e., the third direction Z). In an embodiment, the display device 1 may be folded or unfolded with respect to the folding axis FX disposed in the first direction X, but the disclosure according to the invention is not limited thereto. The folding axis FX may include at least one rotation axis. That is, the display device 1 may be folded or unfolded to have at least one curvature center.

Hereinafter, the display device 1 according to an embodiment will be described in detail with reference to FIGS. 3 to 5.

Figure 3:
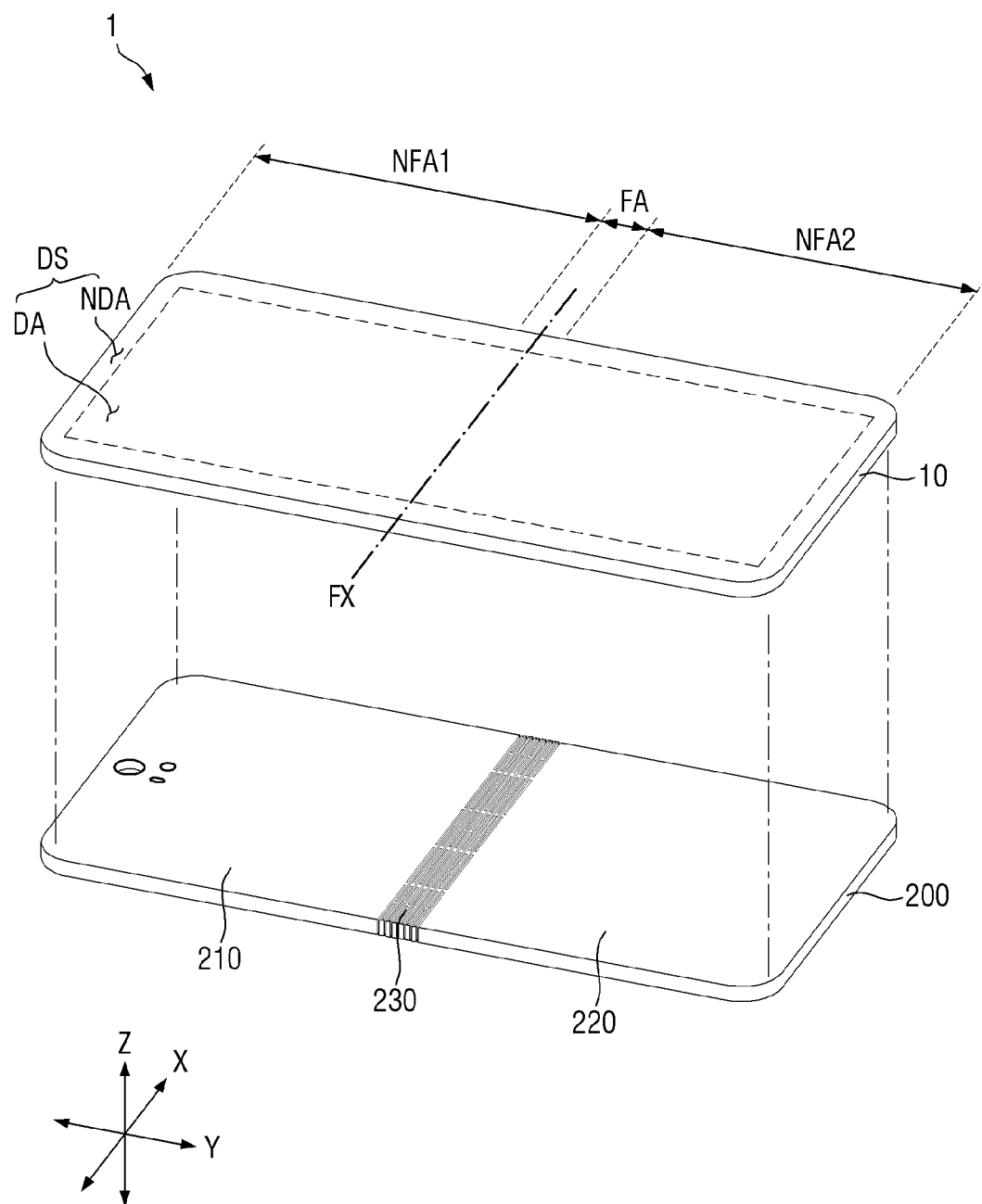
FIG. 3 is an exploded perspective view of the display device of FIG. 1.
Figure 4:
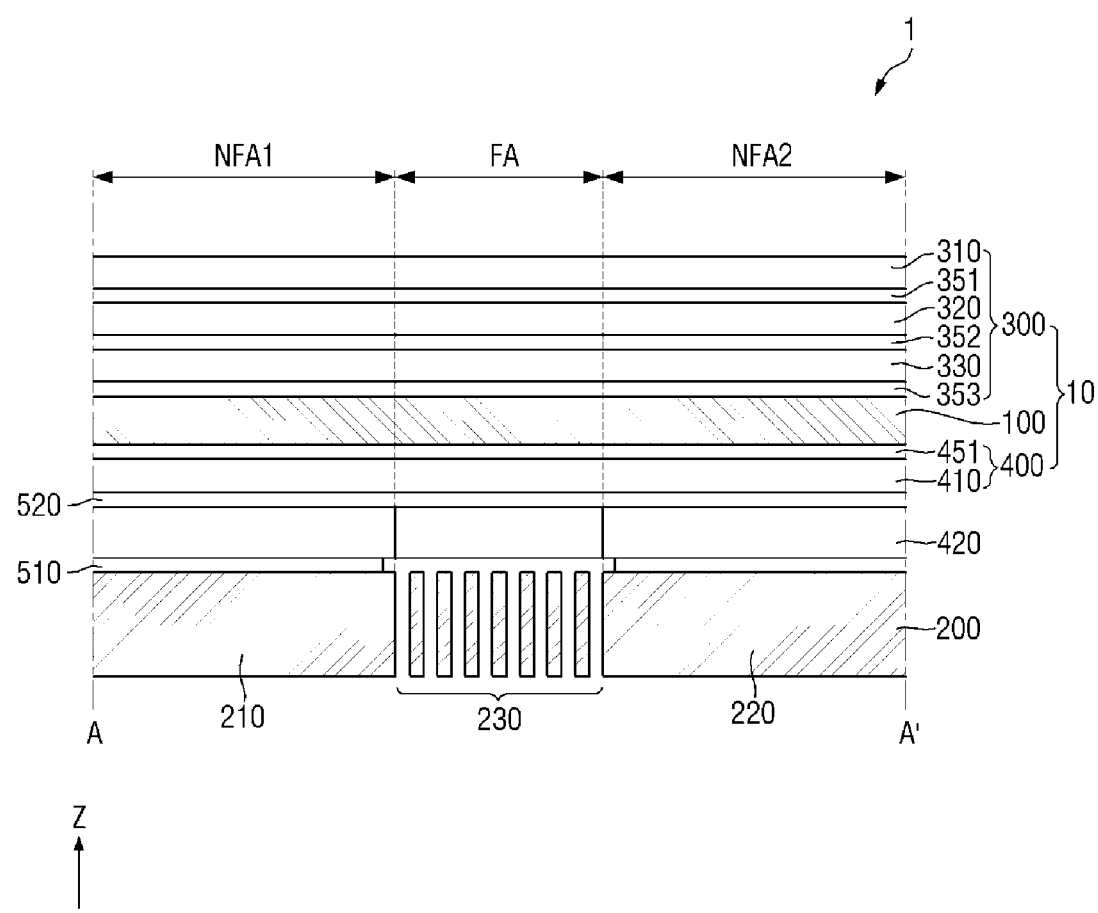
FIG. 4 is a cross-sectional view of the display device taken along line A-A' in FIG. 1.
Figure 5:
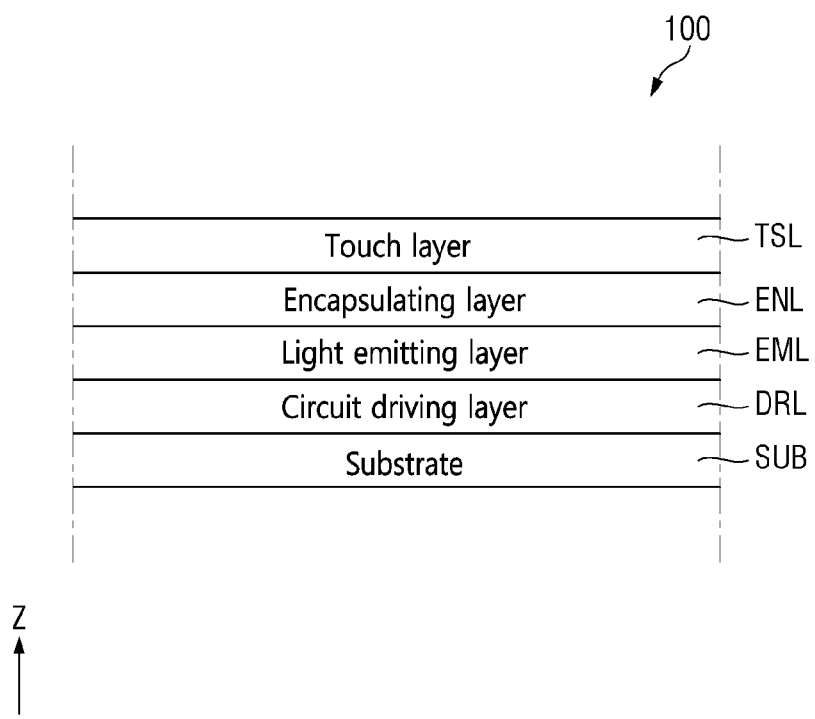
FIG. 5 is a cross-sectional view of a display panel.

FIG. 3 is an exploded perspective view of the display device of FIG. 1, FIG. 4 is a cross-sectional view of the display device taken along line A-A' in FIG. 1, and FIG. 5 is a cross-sectional view of a display panel.

Referring to FIGS. 1 to 5, a display module 10 may be disposed on the front surface of a metal plate 200. The front surface of the display module 10 may correspond to the front surface of the display device 1.

The display module 10 has flexibility. The display module 10 may be disposed over the first non-folding area NFA1, the folding area FA, and the second non-folding area NFA2, and may be folded with respect to the folding axis FX.

Referring to FIG. 4, the display module 10 may include a display panel 100, a front laminate structure 300 and a rear laminate structure 400.

The display module 10 may include a display panel 100, a front laminate structure 300 disposed on the front surface of the display panel 100, and a rear laminate structure 400 disposed on the rear surface of the display panel 100. The front may be a direction in which the display panel 100 displays a screen, and the rear may be a direction opposite to the front.

The display panel 100 is a panel for displaying an video or an image, and examples thereof may include self-light emitting display panels such as an organic light emitting display panel ("OLED"), an inorganic light emitting display panel (inorganic "EL"), a quantum dot light emitting display panel ("QED"), a micro LED display panel (micro-"LED"), a nano LED display panel (nano-LED), a plasma display panel ("PDP"), a field emission display panel ("FED"), and a cathode ray display panel ("CRT"); and light-receiving display panels such as liquid crystal display panel ("LCD") and an electrophoretic display panel ("EPD"). Hereinafter, an organic light emitting display panel will be described as an example of the display panel 100, and unless otherwise specified, the organic light emitting display panel applied to the embodiment will be simply referred to as the display panel 100. However, embodiments according to the invention are not limited to the organic light emitting display panel, and other display panels listed above or known in the art may be applied within the scope of sharing the technical idea.

The display panel 100 may further include a touch member. The touch member may be provided as a panel or film separate from the display panel 100 and attached to the display panel 100, pr may also be provided in the form of a touch layer inside the display panel 100. In the following embodiments, a case where the touch member is provided inside the display panel 100 and included in the display panel 100 is illustrated, but is not limited thereto.

Referring to FIGS. 4 and 5, the display panel 100 includes a substrate SUB, a circuit driving layer DRL on the substrate SUB, a light emitting layer EML on the circuit driving layer DRL, an encapsulation layer ENL on the light emitting layer EML, and a touch layer TSL on the encapsulation layer ENL.

The substrate SUB may be a flexible substrate including a flexible polymer material such as polyimide. Accordingly, the display panel 100 may be warped, bent, folded, or rolled. In some embodiments, the substrate SUB may include a plurality of sub-substrates overlapping in the thickness direction (i.e., the third direction Z) with a barrier layer interposed therebetween. In this case, each of the sub-substrates may be a flexible substrate.

The circuit driving layer DRL may be disposed on the substrate SUB. The circuit driving layer DRL may include a circuit for driving the light emitting layer EML of a pixel. The circuit driving layer DRL may include a plurality of thin film transistors.

The light emitting layer EML may be disposed on the circuit driving layer DRL. The light emitting layer EML may include an organic light emitting layer. The light emitting layer EML may emit light with various luminance according to a driving signal transmitted from the circuit driving layer DRL.

The encapsulation layer ENL may be disposed on the light emitting layer EML. The encapsulation layer ENL may include an inorganic layer or a laminated layer of an inorganic layer and an organic layer.

The touch layer TSL may be disposed on the encapsulation layer ENL. The touch layer TSL, which is a layer for recognizing a touch input, may function as a touch member. The touch layer TSL may include a plurality of sensing areas and a plurality of sensing electrodes.

Referring to FIG. 4 again, the front laminate structure 300 is disposed on the entire surface of the display panel 100. The front laminate structure 300 may include a polarization member 330, a cover window 320, and a cover window protection layer 310, which are sequentially laminated in a direction away from the front surface of the display panel 100.

The polarization member 330 polarizes light. The polarization member 330 may serve to reduce the reflection of external light. In an embodiment, the polarization member 330 may be a polarization film. The polarization film may include a polarization layer and a protective substrate sandwiching the polarization layer from the top and bottom thereof. The polarization layer may include polyvinyl alcohol. The polarization layer may be stretched in one direction. The stretching direction of the polarization layer may be an absorption axis, and the direction perpendicular thereto may be a transmission axis. The protective substrate may be disposed on one surface and the other surface of the polarizing layer. The protective substrate may include or be made of a cellulose resin such as triacetyl cellulose, a polyester resin, or the like, but the material thereof according to the invention is not limited thereto.

The cover window 320 may be disposed in front of the polarization member 330. The cover window 320 serves to protect the display panel 100. The cover window 320 may include or be made of a transparent material. The cover window 320 may be made of, for example, glass or plastic.

When the cover window 320 includes glass, the glass may be ultra-thin glass ("UTG") or thin glass. When the glass is formed as an ultra-thin film or a thin film, it has flexible properties, and may thus be warped, bent, folded, or rolled. The thickness of the glass may be, for example, in the range of about 10 micrometers (μm) to about 300 μm, and specifically, glass having a thickness of about 30 μm to about 80 μm or to about 50 μm may be applied. The glass of the cover window 320 may include soda lime glass, alkali alumino silicate glass, borosilicate glass, or lithium alumina silicate glass. The glass of the cover window 320 may include chemically reinforced or thermally reinforced glass to have strong strength. The chemical reinforcement may be achieved through an ion exchange treatment process in an alkali salt. The ion exchange treatment process may be performed two or more times.

When the cover window 320 includes plastic, it may be more advantageous to exhibit flexible properties such as folding. Examples of the plastic applicable to the cover window 320 may include, but are not limited to, polyimide, polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene, ethylene-vinyl alcohol copolymers, polyethersulfone ("PES"), polyetherimide ("PEI"), polyphenylene sulfide ("PPS"), polyallylate, tri-acetyl cellulose ("TAC"), and cellulose acetate propionate ("CAP"). The plastic cover window 320 may include or be formed of one or more of the plastic materials listed above.

The cover window protection layer 310 may be disposed in the front (i.e., the top) of the cover window 320. The cover window protection layer 310 may perform at least one function of scattering prevention, shock absorption, imprint prevention, fingerprint prevention, and anti-glare of the cover window 320. The cover window protection layer 310 may include or be formed of a transparent polymer film. The transparent polymer film may include at least one of polyethylene terephthalate ("PET"), polyethylene naphthalate (PEN), polyether sulfone (PES), polyimide ("PI"), polyarylate ("PAR"), polycarbonate ("PC"), polymethylmethacrylate (PMMA), or a cycloolefin copolymer ("COC").

The front laminate structure 300 may include front coupling members 351, 352, and 353 coupling adjacent laminated members. For example, a first front coupling member 351 may be disposed between the cover window 320 and the cover window protection layer 310 to couple the cover window 320 and the cover window protection layer 310, a second front coupling member 352 may be disposed between the cover window 320 and the polarization member 330 to couple the cover window 320 and the polarization member 330, and a third front coupling member 353 may be disposed between the polarization member 330 and the display panel 100 to couple the polarization member 330 and the display panel 100. That is, the front coupling members 351, 352, and 353 are members for attaching layers onto one surface (i.e., front surface) of the display panel 100. Here, the first front coupling member 351 may be a protection layer coupling member for attaching the cover window protection layer 310, the second front coupling member 352 may be a window coupling member for attaching the cover window 320, and the third front coupling member 353 may be a polarization unit coupling member for attaching the polarization member 330. The front coupling members 351, 352, and 353 may all be optically transparent.

The rear laminate structure 400 is disposed below the display panel 100. The rear laminate structure 400 may include a polymer film layer 410 disposed below the display panel 100.

The polymer film layer 410 may include a polymer. The polymer film layer 410 may include, for example, polyimide (PI), polyethylene terephthalate (PET), polycarbonate (PC), polyethylene ("PE"), polypropylene ("PP"), polysulfone ("PSF"), polymethylmethacrylate (PMMA), triacetyl cellulose ("TAC"), or a cycloolefin polymer ("COP"). The polymer film layer 410 may include a function layer on at least one surface thereof. The function layer may include, for example, a light absorbing layer. The light absorbing layer may include a light absorbing material such as a black pigment or dye. The light absorbing layer may be formed on a polymer film by coating or printing using black ink.

The rear laminate structure 400 may include a rear coupling member 451 for coupling adjacent laminated members. For example, the rear coupling member 451 may be disposed between the display panel 100 and the polymer film layer 410 to couple the display panel 100 and the polymer film layer 410.

A first barrier member 420 and a metal plate 200 may be disposed below the display module 10.

In an embodiment, the first barrier member 420 may be disposed below the polymer film layer 410. The first barrier member 420 may prevent foreign matter from being introduced into the display module 10 from the outside. The first barrier member 420 may include or be made of a stretchable material having a variable length according to folding and unfold operations of the display device 1. A detailed configuration of the first barrier member 420 will be described later.

Referring to FIGS. 1 to 4, the display device 1 according to an embodiment may include a metal plate 200 disposed below the display module 10.

The metal plate 200 may be disposed on the rear surface of the first barrier member 420. The metal plate 200 may be disposed to overlap the first non-folding area NFA1, the folding area FA, and the second non-folding area NFA2. The metal plate 200 has flexibility, and may be folded with respect to the folding axis FX. The metal plate 200 may be configured to be stretchable at least partially by including a pattern defining a plurality of openings.

The metal plate 200 may have a rectangular shape that is long in the second direction Y and short in the first direction X in a plan view, but the shape thereof is not limited thereto. In an embodiment, the metal plate 200 may include front and rear surfaces parallel to a plane defined by crossing the first direction X and the second direction Y, and side surfaces extending in the third direction Z between the front and back surfaces.

The metal plate 200 may have a larger size than the display module 10. In some embodiments, the length of the metal plate 200 in the first direction X and the length of the metal plate 200 in the second direction Y may be larger than those of the display module 10, respectively. The metal plate 200 may have a thin thickness of about 0.1 millimeters (mm) to 0.2 mm in the third direction Z.

The metal plate 200 may include stainless steel. The stainless steel may include at least one of iron, chromium, carbon, nickel, silicon, manganese, molybdenum, or alloys thereof. In an embodiment, the metal plate 200 may include or be made of austenitic stainless steel.

In an embodiment, the metal plate 200 may include a first plate portion 210, a second plate portion 220, and a connection portion 230.

The first plate portion 210 and the second plate portion 220 are arranged in the second direction Y. The first plate portion 210 and the second plate portion 220 may be symmetrically arranged with respect to the folding axis FX or the folding area FA. In an embodiment, the first plate portion 210 may be disposed to overlap the first non-folding area NFA1, and the second plate portion 220 may be disposed to overlap the second non-folding area NFA2. Accordingly, the first plate portion 210 and the second plate portion 220 may maintain flatness regardless of folding of the display device 1. Each of the first plate portion 210 and the second plate portion 220 may have a rectangular shape on a plane, but the shape thereof is not limited thereto. In an embodiment, when the display device 1 is folded, the first plate portion 210 and the second plate portion 220 may be portions that maintain a length or size without being stretched compared those in the unfolded state.

The connection portion 230 may be disposed between the first plate portion 210 and the second plate portion 220. The connection portion 230 may be disposed in the folding area FA. The connection portion 230 may be disposed to overlap the folding axis FX in the thickness direction and extends in the first direction X. The connection portion 230 has flexibility. The connection portion 230 may be stretched or compressed by folding or unfolding of the metal plate 200. The connection portion 230 may have higher elasticity than the first plate portion 210 and/or the second plate portion 220. The connection portion 230 may reduce tensile or compressive stress caused by bending of the metal plate 200. The connection portion 230 may include a pattern defining a plurality of openings.

The first barrier member 420 and the metal plate 200, described above, may be coupled through the second coupling member 520 and the first coupling member 510, respectively, so as to be coupled to the rear of the display module 10.

Specifically, the second coupling member 520 may be disposed between the polymer film layer 410 and the first barrier member 420 to couple the polymer film layer 410 and the first barrier member 420. Further, the first coupling member 510 may be disposed between the first barrier member 420 and the metal plate 200 to couple the first barrier member 420 and the metal plate 200.

Hereinafter, the first barrier member 420 and the metal plate 200 will be described in more detail with reference to FIGS. 6 and 7.

Figure 6:
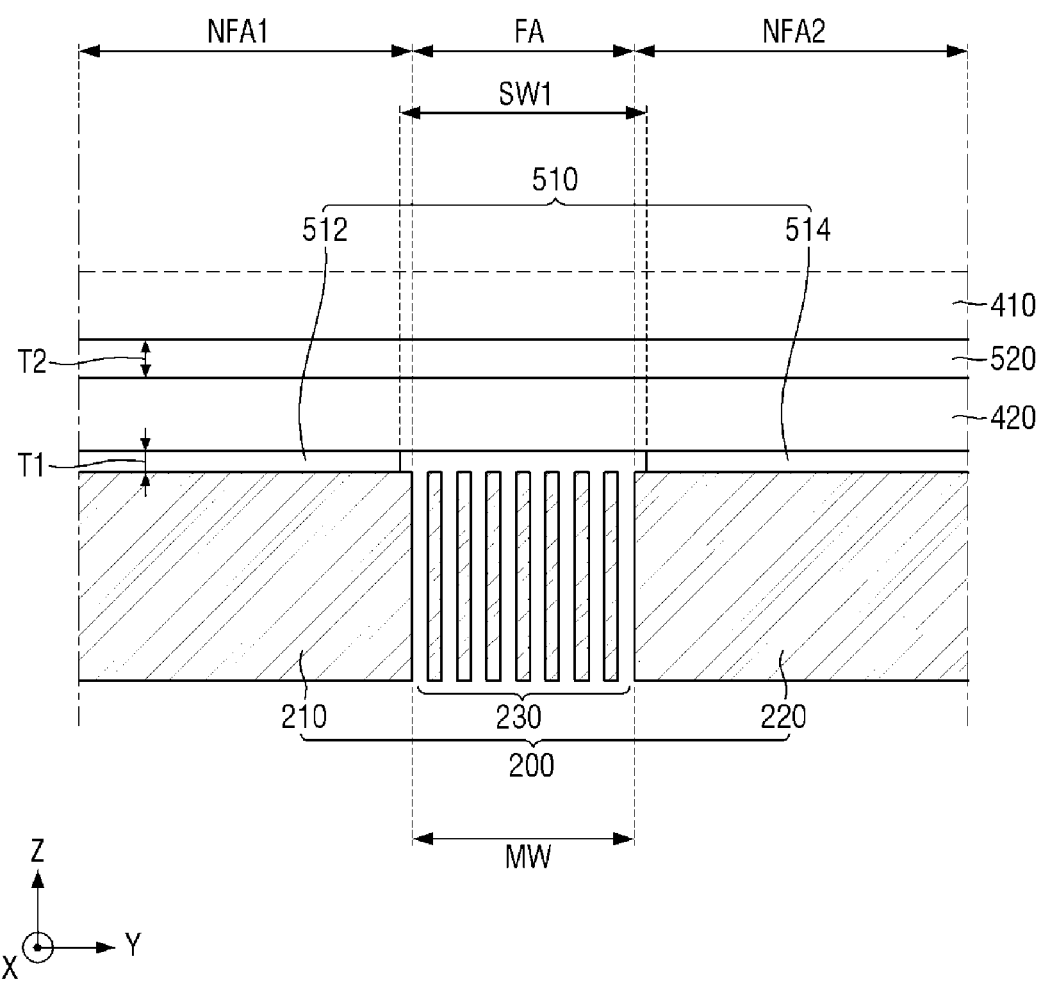
FIG. 6 is a cross-sectional view illustrating a portion of a display device according to an embodiment.
Figure 7:
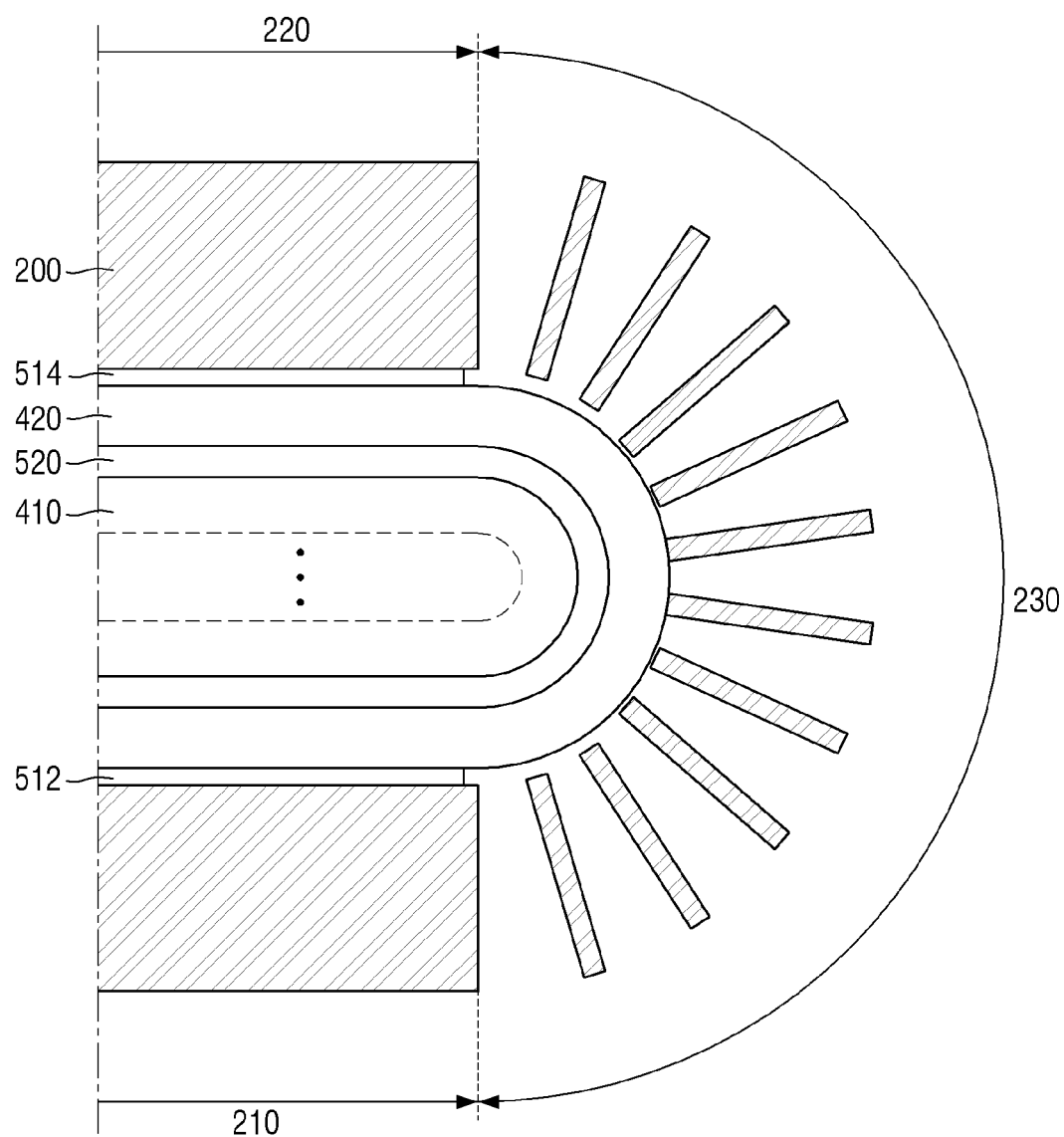
FIG. 7 is a cross-sectional view illustrating a portion of a display device according to an embodiment in a folded state.
Figure 8:
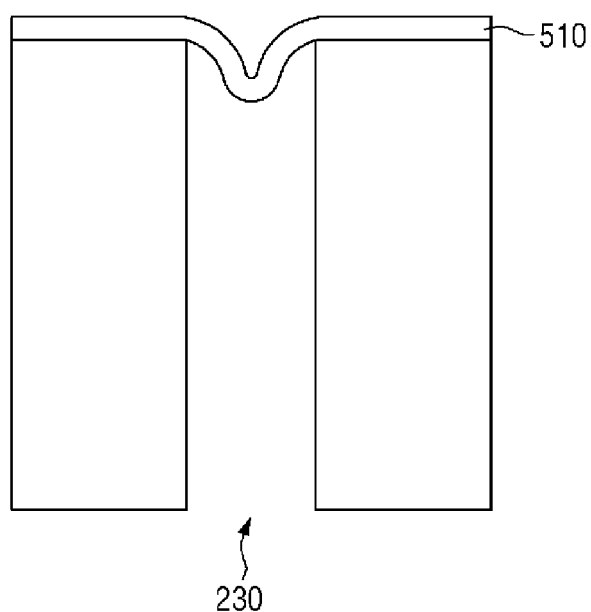
FIG. 8 is a schematic cross-sectional view of a connection portion between a first coupling member and a metal plate.

FIG. 6 is a cross-sectional view illustrating a portion of a display device according to an embodiment, FIG. 7 is a cross-sectional view illustrating a portion of a display device according to an embodiment in a folded state, and FIG. 8 is a schematic cross-sectional view of a connection portion between a first coupling member and a metal plate. In order to illustrate a relationship between the first barrier member 420 and the metal plate 200, in FIGS. 6 and 7, only the polymer film layer 410, the second coupling member 520, the first barrier member 420, the first coupling member 510, and the metal plate 200 of the display device 1 will be illustrated and described.

Referring to FIG. 6, the display device 1 according to an embodiment may include a polymer film layer 410, a second coupling member 520 disposed on the rear surface (i.e., lower surface) of the polymer film layer 410, a first barrier member 420 disposed on the rear surface of the second coupling member 520, a first coupling member 510 disposed on the rear surface of the first barrier member 420, and a metal plate 200 disposed on the rear surface of the first coupling member 510.

In an embodiment, the first barrier member 420 may have a large modulus so as not to be deformed by the shape of a lattice pattern of the connection portion 230 of the metal plate 200. For example, the first barrier member 420 may include or be made of a material having a modulus of about 1 gigapascals (GPa) or more. Specifically, the first barrier member 420 may have a modulus ranging from about 1 GPa to about 300 GPa.

In an embodiment, the first barrier member 420 may include a polymer material having elastic or plastic properties. The first barrier member 420 may include, for example, at least one selected from polyimide (PI), polyacrylate ("PA"), polymethyl methacrylate (PMMA), polycarbonate (PC), polyethylene terephthalate (PET), polyethylene naphthalate (PEN), polyether sulfone (PES), polyarylate (PAR), and a cycloolefin copolymer (COC).

When the first barrier member 420 includes a polymer material, the first barrier member 420 may have a modulus ranging from about 1 GPa to about 10 GPa. Preferably, the first barrier member 420 may have a modulus ranging from about 3 GPa to about 7 GPa.

As shown in FIG. 7, in a state where the display device 1 is folded, the connection portion 230 of the metal plate 200 may contact the first barrier member 420 to apply a force pressing the first barrier member 420. At this time, when high heat is applied, the shape of the lattice pattern of the connection portion 230 may remain in the first barrier member 420 pressed by the connection portion 230 to be recognized by the user.

In an embodiment, the modulus of the first barrier member 420 is made large in the range of about 1 GPa to about 10 GPa, so that the lattice pattern of the connection portion 230 of the metal plate 200 may not remain. Further, the thickness of the first barrier member 420 may be at least about 25 μm or more, and preferably in the range of about 25 μm to about 80 μm, so that the shape of the lattice pattern of the connection portion 230 may not remain.

In another embodiment, the first barrier member 420 may include a metal. The first barrier member 420 may include, for example, at least one selected from steel used stainless (SUS), invar, aluminum, iron, chromium, carbon, nickel, silicon, manganese, and molybdenum.

When the first barrier member 420 includes metal, the first barrier member 420 may have a modulus ranging from about 10 GPa to about 300 GPa. Preferably, the first barrier member 420 may have a modulus ranging from about 30 GPa to about 200 GPa.

In this embodiment, the modulus of the first barrier member 420 is made large in the range of about 10 GPa to about 300 GPa, so that the lattice pattern of the connection portion 230 of the metal plate 200 may not remain. Further, the thickness of the first barrier member 420 including a metal may be at least about 10 μm or more, and preferably in the range of about 10 µm to about 50 µm, so that the shape of the lattice pattern of the connection portion 230 may not remain.

In an embodiment, in order to prevent the lattice pattern of the connection portion 230 of the metal plate 200 from being viewed by the user, the first barrier member 420 may include a material that exhibits a black color, or black coating may be additionally performed on the upper or lower surface of the first barrier member 420.

Referring to FIG. 6, the second coupling member 520 may be disposed between the first barrier member 420 and the polymer film layer 410 to couple the first barrier member 420 and the polymer film layer 410. Further, the first coupling member 510 may be disposed between the first barrier member 420 and the metal plate 200 to couple the first barrier member 420 and the metal plate 200.

The second coupling member 520 may be disposed on the entire rear surface of the polymer film layer 410, and may be disposed on the entire front surface of the first barrier member 420. The second coupling member 520 may be a pressure sensitive adhesive ("PSA") layer, but is not limited thereto, and any material may be applied as long as it has adhesion or adhesive properties.

The first coupling member 510 may be disposed on the rear surface of the first barrier member 420. The first coupling member 510 may include a first coupling portion 512 and a second coupling portion 514 spaced apart from each other. The first coupling member 510 may be disposed to overlap the first non-folding area NFA1 and the second non-folding area NFA2, respectively.

The first coupling portion 512 and the second coupling portion 514 are arranged in the second direction Y. The first coupling portion 512 and the second coupling portion 514 may be symmetrically arranged with respect to the folding area FA. In an embodiment, the first coupling portion 512 may be disposed to overlap the first non-folding area NFA1, and the second coupling portion 514 may be disposed to overlap the second non-folding area NFA2 in a plan view. Further, the first coupling portion 512 may be disposed to overlap the first plate portion 210 of the metal plate 200, and the second coupling portion 514 may be disposed to overlap the second plate portion 220 of the metal plate 200.

A first spacing interval SW1, through which the first coupling portion 512 and the second coupling portion 514 are spaced apart from each other, may be defined between the first coupling portion 512 and the second coupling portion 514. The first spacing interval SW1 is an empty space. The first spacing interval SW1 may be mainly defined in the folding area FA. The first spacing interval SW1 may be defined to extend in the first direction X.

In an embodiment, the first spacing interval SW1 defined in the first coupling member 510 may overlap the connection portion 230 of the metal plate 200 in a plan view.

As shown in FIG. 8, in a case that the first coupling member 510 overlaps the connection portion 230 of the metal plate 200, a phenomenon in which the first coupling member 510 is pinched in the connection portion 230 of the metal plate 200 occurs. Specifically, when the folding and unfolding of the display device 1 are repeated under high-temperature and high-humidity conditions, the first coupling member 510 may be pinched between the lattice patterns of the connection portion 230. Thus, a bending deformation in which the display module 10 sags downward in the unfolded state of the display device 1 may occur, and thus the shape of the lattice pattern may be visually recognized.

In an embodiment, the first spacing interval SW1 in the first coupling member 510 may be defined to overlap the connection portion 230 of the metal plate 200, thereby preventing the shape of the lattice pattern of the connection portion 230 of the metal plate 200 from being visually recognized. For this purpose, it is preferable that the first spacing interval SW1 in the first coupling member 510 is equal to or larger than the width MW of the connection portion 230 of the metal plate 200.

Referring to FIG. 6 again, in order to improve the impact resistance characteristics of the display device 1 in an embodiment, each of the first coupling member 510 and the second coupling member 520 may have a predetermined thickness range.

Specifically, the thickness T2 of the second coupling member 520 may be about 1 µm to about 50 µm. The second coupling member 520 may have an optimal thickness T2 for coupling the polymer film layer 410 and the first barrier member 420. In this case, the sum T1+T2 of the thickness T1 of the first coupling member 510 and the thickness T2 of the second coupling member 520 may be greater than about 1 µm and equal to or less than about 80 µm or less. As the thickness T1 of the first coupling member 510 and the thickness T2 of the second coupling member 520 increase, impact resistance characteristics may gradually deteriorate, and thus, preferably, the thickness T1 of the first coupling member 510 and the thickness T2 of the second coupling member 520 may not exceed about 80 µm. The thickness T1 of the first coupling member 510 is not limited as long as it satisfies the above conditions, but, preferably, the thickness T1 may be about 25 µm or less in order to prevent the sagging of the first coupling member 510.

Figure 9:
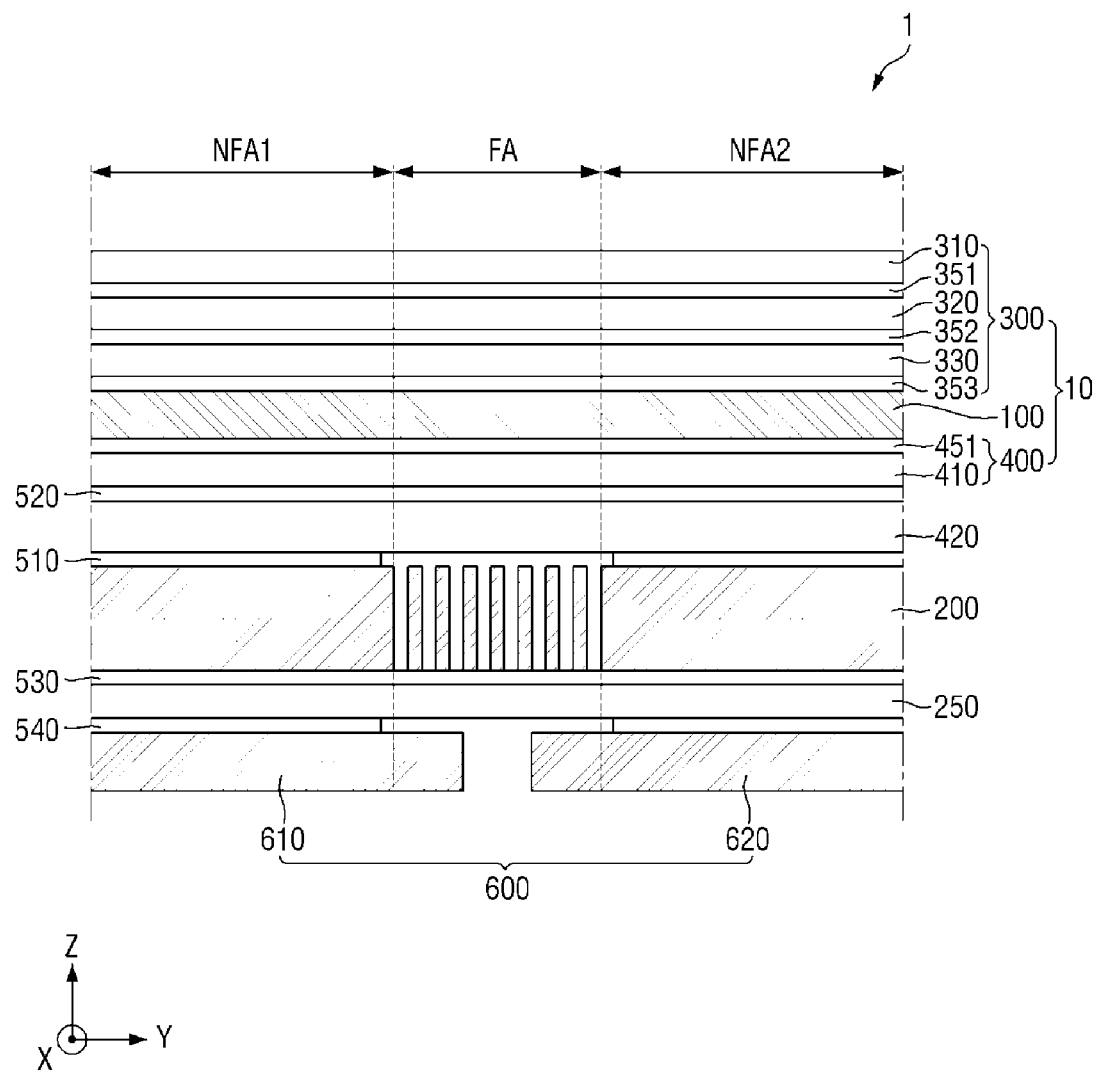
FIG. 9 is a cross-sectional view of a display device according to another embodiment.
Figure 10:
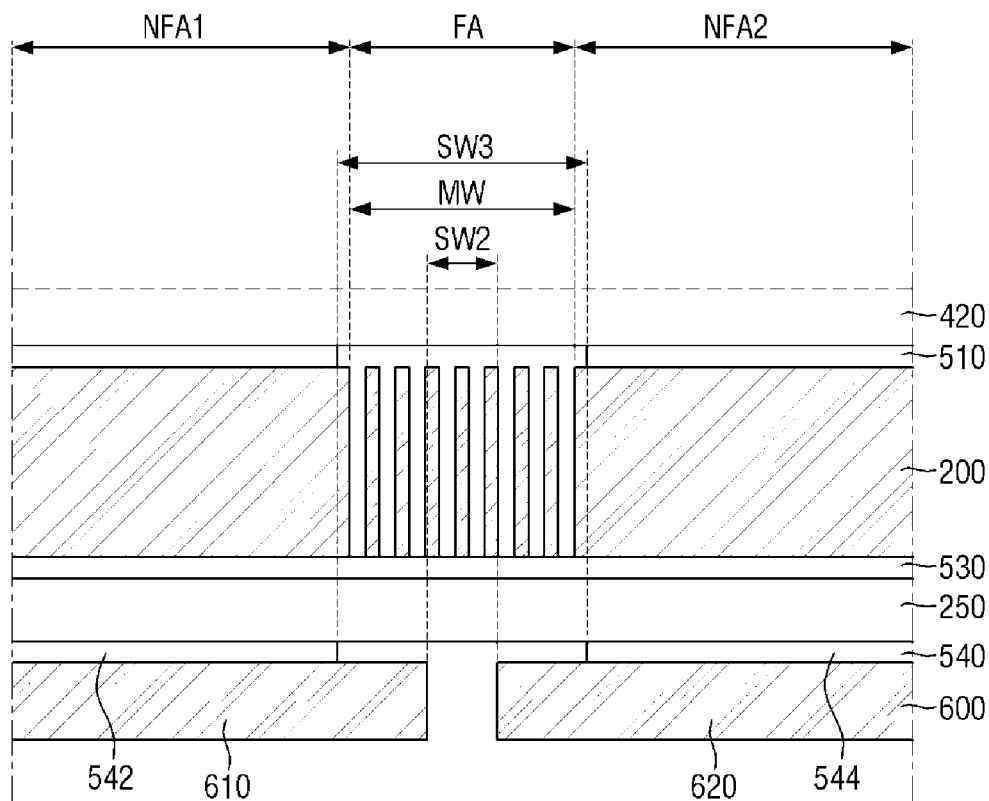
FIG. 10 is a cross-sectional view illustrating a portion of a display device according to the embodiment in FIG. 9.
Figure 10:
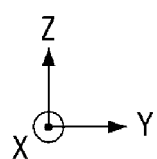

FIG. 9 is a cross-sectional view of a display device according to another embodiment, and FIG. 10 is a cross-sectional view illustrating a portion of the display device according to the embodiment in FIG. 9. In FIG. 10, a first coupling member 510, a metal plate 200, a second barrier member 250, and a heat dissipation member 600 are illustrated and described.

Referring to FIGS. 9 and 10, the display device 1 according to the present embodiment may include a first barrier member 420 and a metal plate 200. In particular, the present embodiment is different from the embodiment described with reference to FIGS. 4 and 6 to 8 in that the second barrier member 250 is further disposed below the metal plate 200, and other components are substantially the same or similar to each other. Therefore, a redundant description will be omitted, and differences will be mainly described.

Referring to FIG. 9, the second barrier member 250 may be disposed on the rear surface of the metal plate 200. The second barrier member 250 may prevent foreign matter from entering the display module 10 from the outside. The second barrier member 250 may include or be made of a stretchable material having a variable length according to folding and unfolding operations of the display device 1.

In an embodiment, the second barrier member 250 may have a small modulus so as to respond to the folding and unfolding operations of the display device 1. For example, the second barrier member 250 may include or be made of a material having a modulus of less than about 1 GPa. In an embodiment, the second barrier member 250 may include a polymer material having hyper elastic properties. The second barrier member 250 may include, for example, thermoplastic polyurethane ("TPU") having elasticity. The second barrier member 250 may have a thickness ranging from about 1 µm to about 20 µm.

A third coupling member 530 is disposed between the metal plate 200 and the second barrier member 250 to couple the metal plate 200 and the second barrier member 250.

The third coupling member 530 may be disposed to overlap the first plate portion 210, the second plate portion 220, and the connection portion 230 of the metal plate 200. In particular, the third coupling member 530 may overlap the connection portion 230 in a plan view to prevent foreign matter from entering the display module 10.

A heat dissipation member 600 may be disposed on the rear surface of the third coupling member 530. More specifically, the heat dissipation member 600 may be disposed on a rear surface of a fourth coupling member 540 (to be described later). The heat dissipation member 600 serves to diffuse heat generated from the display panel 100 or other components of the display device 1. In some embodiments, the heat dissipation member 600 may include a first heat dissipation layer including graphite or carbon nanotubes, and a second heat dissipation layer formed of a metal thin film including copper, nickel, ferrite, or silver, which may block electromagnetic waves and have excellent thermal conductivity.

The heat dissipation member 600 may be disposed to overlap the first non-folding area NFA1, the folding area FA, and the second non-folding area NFA2. The heat dissipation member 600 may have a rectangular shape that is long in the second direction Y and short in the first direction X in a plan view, but the shape thereof is not limited thereto. The heat dissipation member 600 may have a smaller size than each of the display module 10 and the metal plate 200. In some embodiments, the length of the heat dissipation member 600 in the first direction X and the length of the heat dissipation member 600 in the second direction Y may be smaller than those of each of the display module 10 and the metal plate 200, respectively.

In an embodiment, the heat dissipation member 600 may include a first heat dissipation portion 610 and a second heat dissipation portion 620 spaced apart from each other.

The first heat dissipation portion 610 and the second heat dissipation portion 620 are arranged in the second direction Y. The first heat dissipation portion 610 and the second heat dissipation portion 620 may be symmetrically arranged with respect to the folding area FA. In an embodiment, the first heat dissipation portion 610 may be disposed to overlap the first non-folding area NFA1, and the second heat dissipation portion 620 may be disposed to overlap the second non-folding area NFA2. Further, the first heat dissipation portion 610 may be disposed to overlap the first plate portion 210 of the metal plate 200, and the second heat dissipation portion 620 may be disposed to overlap the second plate portion 220 of the metal plate 200 in a plan view.

A second spacing interval SW2, through which the first heat dissipation portion 610 and the second heat dissipation portion 620 are spaced apart from each other, may be defined between the first heat dissipation portion 610 and the second heat dissipation portion 620. The second spacing interval SW2 may be defined in the folding area FA, and may be defined to overlap the connection portion 230 of the metal plate 200 in a plan view. The second spacing interval SW2 is an empty space. Due to the second spacing interval SW2, the first heat dissipation portion 610 and the second heat dissipation portion 620 may maintain flatness regardless of folding of the display device 1 in the folded state of the display device 1. In an embodiment, even when the display device 1 is folded, the first heat dissipation portion 610 and the second heat dissipation portion 620 may be portions that maintain a length or a size without stretching. In an embodiment, the second spacing interval SW2 may be smaller than the width MW of the connection portion 230 of the metal plate 200.

A fourth coupling member 540 may be disposed between the heat dissipation member 600 and the second barrier member 250.

The fourth coupling member 540 may be disposed on the rear surface of the second barrier member 250. The fourth coupling member 540 may include a third coupling portion 542 and a fourth coupling portion 544 spaced apart from each other. The fourth coupling member 540 may be disposed to overlap the first non-folding area NFA1 and the second non-folding area NFA2 in a plan view.

The third coupling portion 542 and the fourth coupling portion 544 are arranged in the second direction Y. The third coupling portion 542 and the fourth coupling portion 544 may be symmetrically arranged with respect to the folding area FA. In an embodiment, the third coupling portion 542 may be disposed to overlap the first non-folding area NFA1, and the fourth coupling portion 544 may be disposed to overlap the second non-folding area NFA2. Further, the third coupling portion 542 may be disposed to overlap the first plate portion 210 of the metal plate 200, and the fourth coupling portion 544 may be disposed to overlap the second plate portion 220.

A third spacing interval SW3, through which the third coupling portion 542 and the fourth coupling portion 544 are spaced apart from each other, may be defined between the third coupling portion 542 and the fourth coupling portion 544. The third spacing interval SW3 may be mainly defined in the folding area FA. The third spacing interval SW3 is an empty space. The third spacing interval SW3 may be defined to extend in the first direction X.

In an embodiment, the third spacing interval SW3 of the fourth coupling member 540 may overlap the connection portion 230 of the metal plate 200 in a plan view. Further, the third spacing interval SW3 in the fourth coupling member 540 may overlap the second spacing interval SW2 of the heat dissipation member 600. The third spacing interval SW3 in the fourth coupling member 540 may be larger than the second spacing interval SW2 of the heat dissipation member 600. That is, the folding operation of the display device 1 may be facilitated by preventing the heat dissipation member 600 from being attached to the fourth coupling member 540 in the folding area FA.

Figure 11:
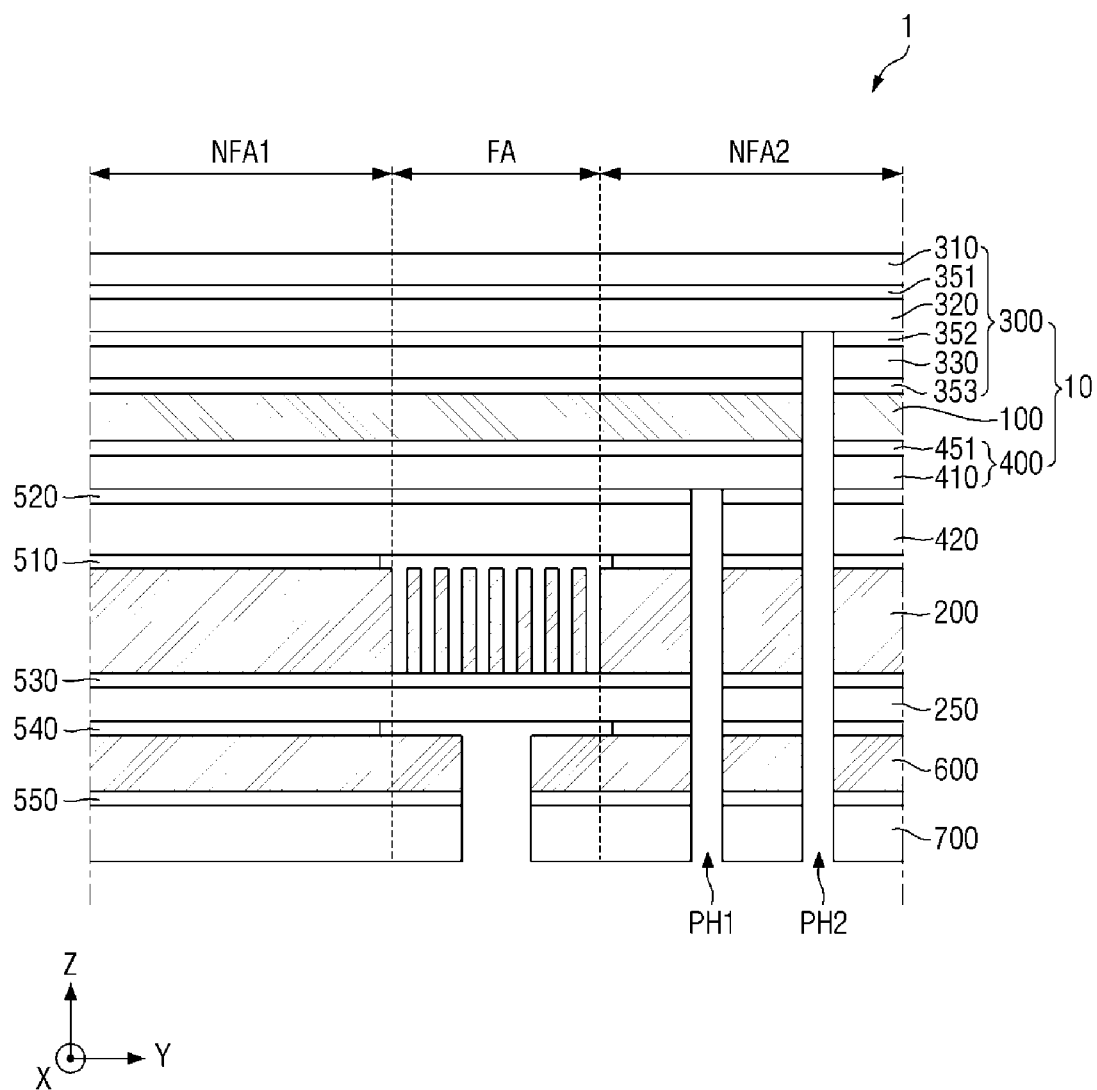
FIG. 11 is a cross-sectional view of a display device according to still another embodiment.
Figure 12:
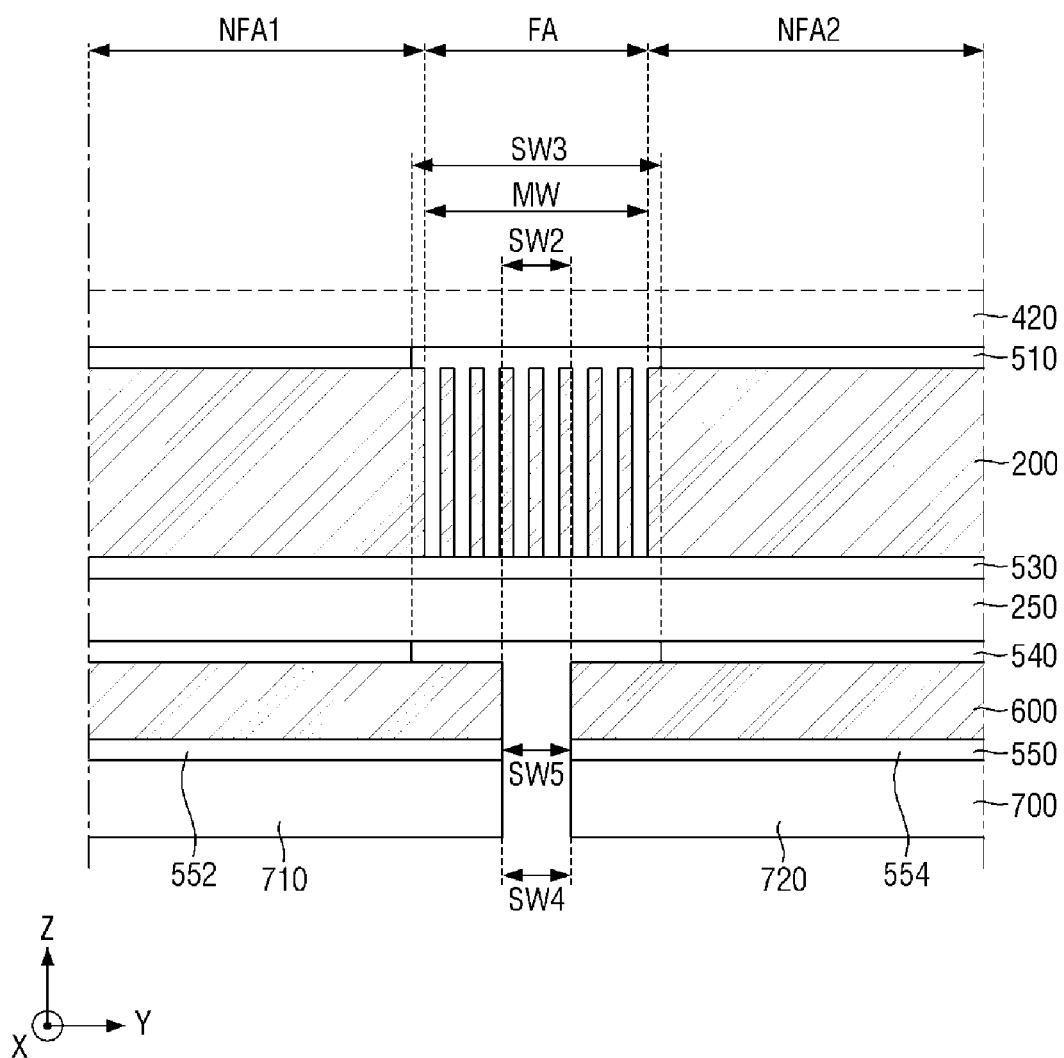
FIG. 12 is a cross-sectional view illustrating a portion of a display device according to the embodiment in FIG. 11.

FIG. 11 is a cross-sectional view of a display device according to still another embodiment, and FIG. 12 is a cross-sectional view illustrating a portion of a display device according to the embodiment of FIG. 11. In FIG. 12, a first coupling member 510, a metal plate 200, a second barrier member 250, a heat dissipation member 600, and a cushion member 700 are illustrated and described.

Referring to FIGS. 11 and 12, the display device 1 according to the present embodiment may include a first barrier member 420, a metal plate 200, a second barrier member 250, and a heat dissipation member 600. In particular, the present embodiment is different from the embodiment described with reference to FIGS. 4 and 6 to 10 in that the cushion member 700 is further disposed below the heat dissipation member 600, and function holes PH1 and PH2 are arranged in the display device 1, and other components are substantially the same or similar to each other. Therefore, a redundant description will be omitted, and differences will be mainly described.

Referring to FIGS. 11 and 12, the cushion member 700 may be further disposed below the heat dissipation member 600. The cushion member 700 may absorb external impacts to prevent the display panel 100 from being damaged. The cushion member 700 may be a single layer or a plurality of laminated layers. The cushion member 700 may include or be made of, for example, a material having elasticity such as polyurethane or polyethylene resin. In an embodiment, the cushion member 700 may include or be made of a foam material similar to a sponge.

In an embodiment, the cushion member 700 may be disposed to overlap the first non-folding area NFA1, the folding area FA, and the second non-folding area NFA2. The cushion member 700 may have a rectangular shape that is long in the second direction Y and short in the first direction X in a plan view, but the shape thereof is not limited thereto. The cushion member 700 may have a smaller size than each of the display module 10 and the metal plate 200. In some embodiments, the length of the cushion member 700 in the first direction X and the length of the cushion member 700 in the second direction Y may be smaller than those of each of the display module 10 and the metal plate 200, respectively. Further, the cushion member 700 may have substantially the same size as the aforementioned heat dissipation member 600.

In an embodiment, the cushion member 700 may include a first cushion portion 710 and a second cushion portion 720 spaced apart from each other.

The first cushion portion 710 and the second cushion portion 720 are arranged in the second direction Y. The first cushion portion 710 and the second cushion portion 720 may be symmetrically arranged with respect to the folding area FA. In an embodiment, the first cushion portion 710 may be disposed to overlap the first non-folding area NFA1, and the second cushion portion 720 may be disposed to overlap the second non-folding area NFA2 in a plan view. Further, the first cushion portion 710 may be disposed to overlap the first plate portion 210 of the metal plate 200, and the second cushion portion 720 may be disposed to overlap the second plate portion 220.

A fourth spacing interval SW4, through which the first cushion portion 710 and the second cushion portion 720 are separated from each other, may be defined between the first cushion portion 710 and the second cushion portion 720. The fourth spacing interval SW4 may be defined in the folding area FA, and may be defined to overlap the connection portion 230 of the metal plate 200. The fourth spacing interval SW4 is an empty space. Due to the fourth spacing interval SW4, the first cushion portion 710 and the second cushion portion 720 may maintain flatness regardless of folding of the display device 1 even in the folded state of the display device 1. In an embodiment, even when the display device 1 is folded, the first cushion portion 710 and the second cushion portion 720 may be portions that maintain a length or a size without stretching. In an embodiment, the fourth spacing interval SW4 may be smaller than the width MW of the connection portion 230 of the metal plate 200. The fourth spacing interval SW4 of the cushion member 700 may overlap the second spacing interval SW2 of the heat dissipation member 600, and may have substantially the same width as the second spacing interval SW2 of the heat dissipation member 600.

A fifth coupling member 550 may be disposed between the cushion member 700 and the heat dissipation member 600.

The fifth coupling member 550 may be disposed on the rear surface of the heat dissipation member 600. The fifth coupling member 550 may include a fifth coupling portion 552 and a sixth coupling portion 554 spaced apart from each other. The fifth coupling member 550 may be disposed to overlap the first non-folding area NFA1 and the second non-folding area NFA2.

The fifth coupling portion 552 and the sixth coupling portion 554 are arranged in the second direction Y. The fifth coupling portion 552 and the sixth coupling portion 554 may be symmetrically arranged with respect to the folding area FA. In an embodiment, the fifth coupling portion 552 may be disposed to overlap the first non-folding area NFA1, and the sixth coupling portion 554 may be disposed to overlap the second non-folding area NFA2. Further, the fifth coupling portion 552 may be disposed to overlap the first plate portion 210 of the metal plate 200, and the sixth coupling portion 554 may be disposed to overlap the second plate portion 220.

A fifth spacing interval SW5, through which the fifth coupling portion 552 and the sixth coupling portion 554 are spaced apart from each other, may be defined between the fifth coupling portion 552 and the sixth coupling portion 554. The fifth spacing interval SW5 may be defined in the folding area FA. The fifth spacing interval SW5 may be defined to extend in the first direction X. The fifth spacing interval SW5 is an empty space.

In an embodiment, the fifth spacing interval SW5 in the fifth coupling member 550 may overlap the connection portion 230 of the metal plate 200. Further, the fifth spacing interval SW5 of the fifth coupling member 550 may overlap the second spacing interval SW2 of the heat dissipation member 600, and may overlap the fourth spacing interval SW4 of the cushion member 700 in a plan view. Further, the fifth spacing interval SW5 in the fifth coupling member 550 may be substantially the same as the second spacing interval SW2 of the heat dissipation member 600 and the fourth spacing interval SW4 of the cushion member 700.

Referring to FIG. 11, the display device 1 may further include a plurality of function holes PH1 and PH2.

The plurality of function holes PH1 and PH2 may be defined to overlap the first non-folding area NFA1 or the second non-folding area NFA2. In an embodiment, the plurality of function holes PH1 and PH2 may be defined in the second non-folding area NFA2, and may penetrate predetermined structures in the third direction Z.

An infrared sensor or a motion sensor may be disposed in the first function hole PH1, and a camera may be disposed in the second function hole PH2. The first function hole PH1 may penetrate the first barrier member 420, the metal plate 200, the second barrier member 250, the heat dissipation member 600, and the cushion member 700. In an embodiment, the first function hole PH1 may penetrate the second coupling member 520, the first barrier member 420, the first coupling member 510, the metal plate 200, the third coupling member 530, the second barrier member 250, the fourth coupling member 540, the heat dissipation member 600, the fifth coupling member 550, and the cushion member 700.

The second function hole PH2 may penetrate other laminate structures except for the cover window 320 and the cover window protection layer 310. In an embodiment, the second function hole PH2 may penetrate the second front coupling member 352, the polarization member 330, the third front coupling member 353, the display panel 100, the first rear coupling member 451, the polymer film layer 410, the second coupling member 520, the first barrier member 420, the first coupling member 510, the metal plate 200, the third coupling member 530, the second barrier member 250, the fourth coupling member 540, the heat dissipation member 600, the fifth coupling member 550, and the cushion member 700.

In the display devices according to the aforementioned embodiments, the cushion member may be disposed on the rear surface (i.e., lower surface) of the metal plate, thereby improving impact resistance characteristics. Further, the first barrier member having a large modulus may be disposed, thereby preventing the shape of the lattice pattern of the connection portion of the metal plate from being visually recognized. Further, the thicknesses of the first coupling member and the second coupling member respectively disposed over and under the first barrier member may be set in a predetermined range, thereby improving impact resistance characteristics. Further, the first coupling member disposed between the first barrier member and the metal plate may be formed not to overlap the connection portion of the metal plate, thereby preventing the display module from sagging in an area overlapping the connection portion of the metal plate.

Hereinafter, the impact resistance characteristics and pattern visibility characteristics of the display devices according to the aforementioned embodiments will be described through Manufacturing Examples and Experimental Examples.

Figure 13:
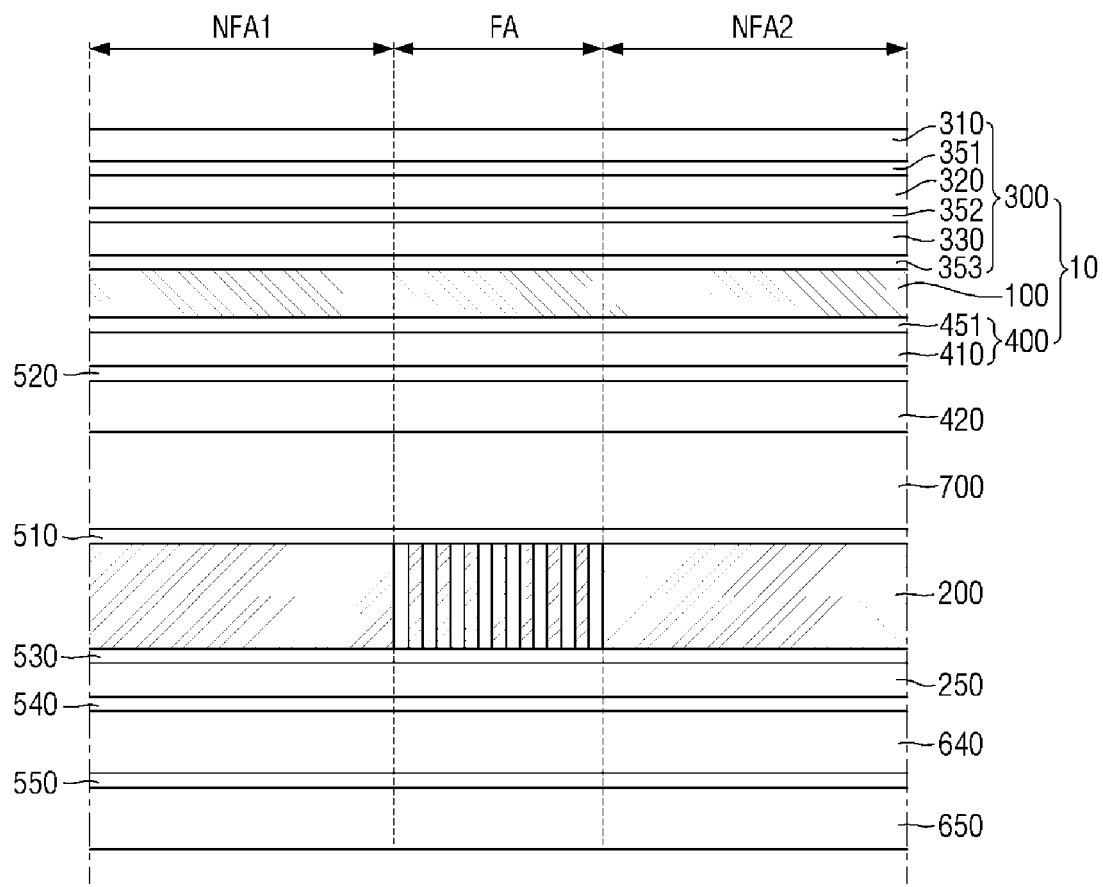
FIG. 13 is a cross-sectional view illustrating a display device sample #1 according to Manufacturing Example.

FIG. 13 is a cross-sectional view illustrating a display device sample #1 according to Manufacturing Example.

Manufacturing Example 1: Manufacturing of Display Device Sample

The display device shown in FIG. 13 was manufactured as display device sample #1. Specifically, a display device in which a cover window protection layer 310, a first front coupling member 351, a cover window 320, a second front coupling member 352, a polarization member 330, a third front coupling member 353, a display panel 100, a first rear coupling member 451, a polymer film layer 410, a second coupling member 520, a first barrier member 420, a cushion member 700, a first coupling member 510, a metal plate 200, a third coupling member 530, a second barrier member 250, a fourth coupling member 540, a first heat dissipation member 640, a fifth coupling member 550, and a second heat dissipation member 650 are sequentially laminated was manufactured.

The display device shown in FIG. 11 was manufactured as display device sample #2. Since the display device of FIG. 11 has been described above, a description thereof is omitted. In this case, the display device sample #2 was manufactured such that the sum of the thickness of the first coupling member 510 and the thickness of the second coupling member 520 was about 110 $\mu m$.

Display device sample #3 was manufactured in the same manner as in the display device sample #2 except that the sum of the thickness of the first coupling member 510 and the thickness of the second coupling member 520 was about 80 $\mu m$.

Display device sample #4 was manufactured in the same manner as in the display device sample #2 except that the sum of the thickness of the first coupling member 510 and the thickness of the second coupling member 520 was about 65 $\mu m$.

Display device sample #5 was manufactured in the same manner as in the display device sample #2 except that the sum of the thickness of the first coupling member 510 and the thickness of the second coupling member 520 was about 50 $\mu m$.

Display device sample #6 was manufactured in the same manner as in the display device sample #2 except that the sum of the thickness of the first coupling member 510 and the thickness of the second coupling member 520 was about 35 $\mu m$.

Display device sample #7 was manufactured in the same manner as in the display device sample #2 except that the sum of the thickness of the first coupling member 510 and the thickness of the second coupling member 520 was about 25 $\mu m$.

Experimental Example 1: Measurement of Impact Resistance Characteristics

A pencil drop test was performed on each of the display device samples #1 to #7 to measure impact resistance characteristics. Results thereof are given in Table 1 below. In Table 1, the effect of improving impact resistance is based on an increase in pencil drop height with respect to the display device sample #1.

TABLE 1

| | Sample# | | | | | | |
|---|---|---|---|---|---|---|---|
| | #1 | #2 | #3 | #4 | #5 | #6 | #7 |
| Pencil drop height | — | — | 1 cm | 2 cm | 3 cm | 4 cm | 5 cm |

Referring to Table 1 above, with respect to the display device sample #1 in which the cushion member 700 is disposed on the metal plate 200, pencil drop heights were increased in samples #3 to #7 in each which the cushion member 700 is disposed under the metal plate 200. In particular, in the display device sample #2 in which the sum of the thicknesses of the first coupling member 510 and the thickness of the second coupling member 520 is about 110 $\mu m$, the pencil drop height was not changed, but in the display device samples #3 to #7 in each which the sum of the thicknesses of the first coupling member 510 and the thickness of the second coupling member 520 is about 80 $\mu m$, about 65 $\mu m$, about 50 $\mu m$, about 35 $\mu m$, and about 25 $\mu m$, respectively, the pencil drop height was increased as the sum of the thicknesses of the first coupling member 510 and the thickness of the second coupling member 520 was decreased.

Consequently, in the display device 1 according to an embodiment, the sum of the thicknesses of the first coupling member 510 and the thickness of the second coupling member 520 is in a range of about 25 $\mu m$ to about 80 $\mu m$, and thus it may be seen that impact resistance characteristics are improved.

Figure 14:
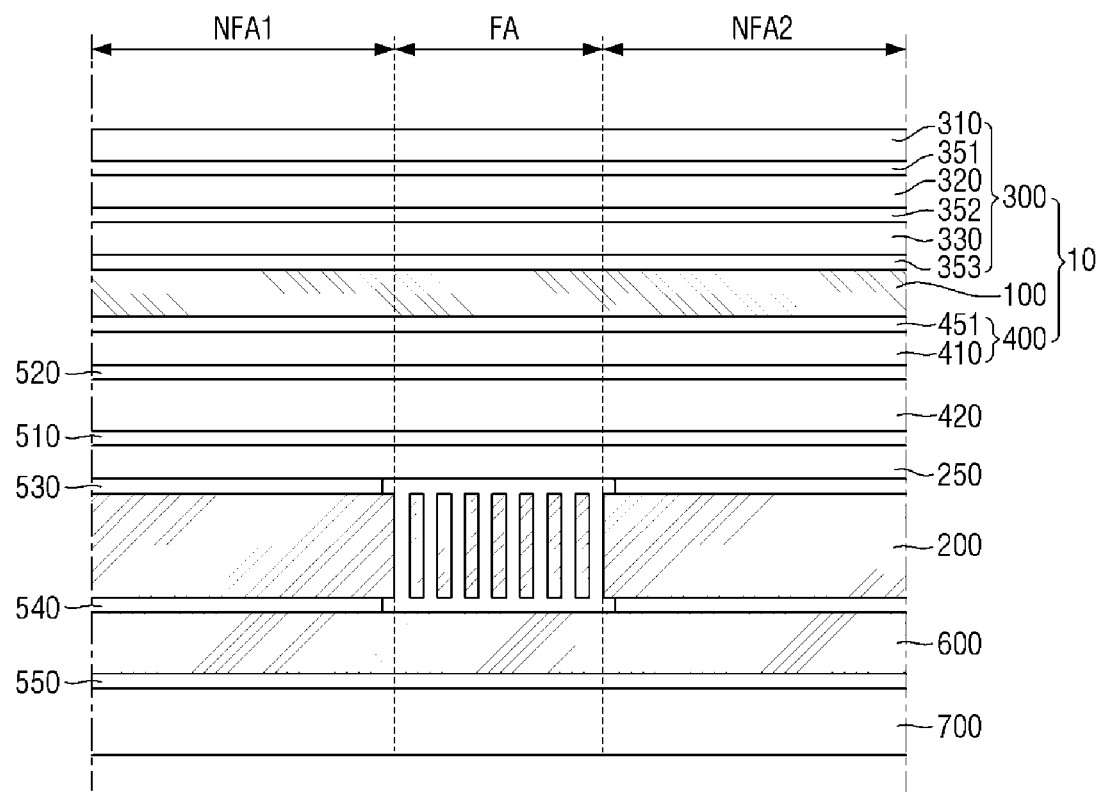
FIG. 14 is a cross-sectional view illustrating a display device sample #8 according to Manufacturing Example.

FIG. 14 is a cross-sectional view illustrating a display device sample #8 according to Manufacturing Example.

Manufacturing Example 2: Manufacturing of Display Device Sample

The display device shown in FIG. 14 was manufactured as display device sample #8. Specifically, a display device in which a cover window protection layer 310, a first front coupling member 351, a cover window 320, a second front coupling member 352, a polarization member 330, a third front coupling member 353, a display panel 100, a first rear coupling member 451, a polymer film layer 410, a second coupling member 520, a first barrier member 420, a first coupling member 510, a second barrier member 250, a third coupling member 530, a metal plate 200, a fourth coupling member 540, a heat dissipation member 600, a fifth coupling member 550, and a cushion member 700 are sequentially laminated was manufactured. In this case, the display device was manufactured such that the thickness of each of the second coupling member 520 and the first barrier member 420 disposed on the metal plate 200 is about 25 µm and the thickness of each of the first coupling member 510, the second barrier member 250, and the third coupling member 530 is about 8 µm.

The display device shown in FIG. 11 was manufactured as display device sample #9. Since the display device of FIG. 11 has been described above, a description thereof is omitted. In this case, the display device sample #9 was manufactured such that the thickness of each of the second coupling member 520 and the first barrier member 420 is about 25 µm and the thickness of the first coupling member 510 is about 8 µm. Further, the display device sample #9 was manufactured such that the first barrier member 420 has a modulus of about 4.5 GPa and includes polyimide.

Display device sample #10 was manufactured in the same manner as in the display device sample #9 except that the modulus of the barrier member 420 was about 10 GPa.

Display device sample #11 was manufactured in the same manner as in the display device sample #9 except that the thickness of the barrier member 420 was 3 about 5 µm.

Display device sample #12 was manufactured in the same manner as in the display device sample #9 except that the thickness of the first coupling member 510 was about 16 µm.

Experimental Example 2: Measurement of Lattice Pattern Visibility

Figure 15:
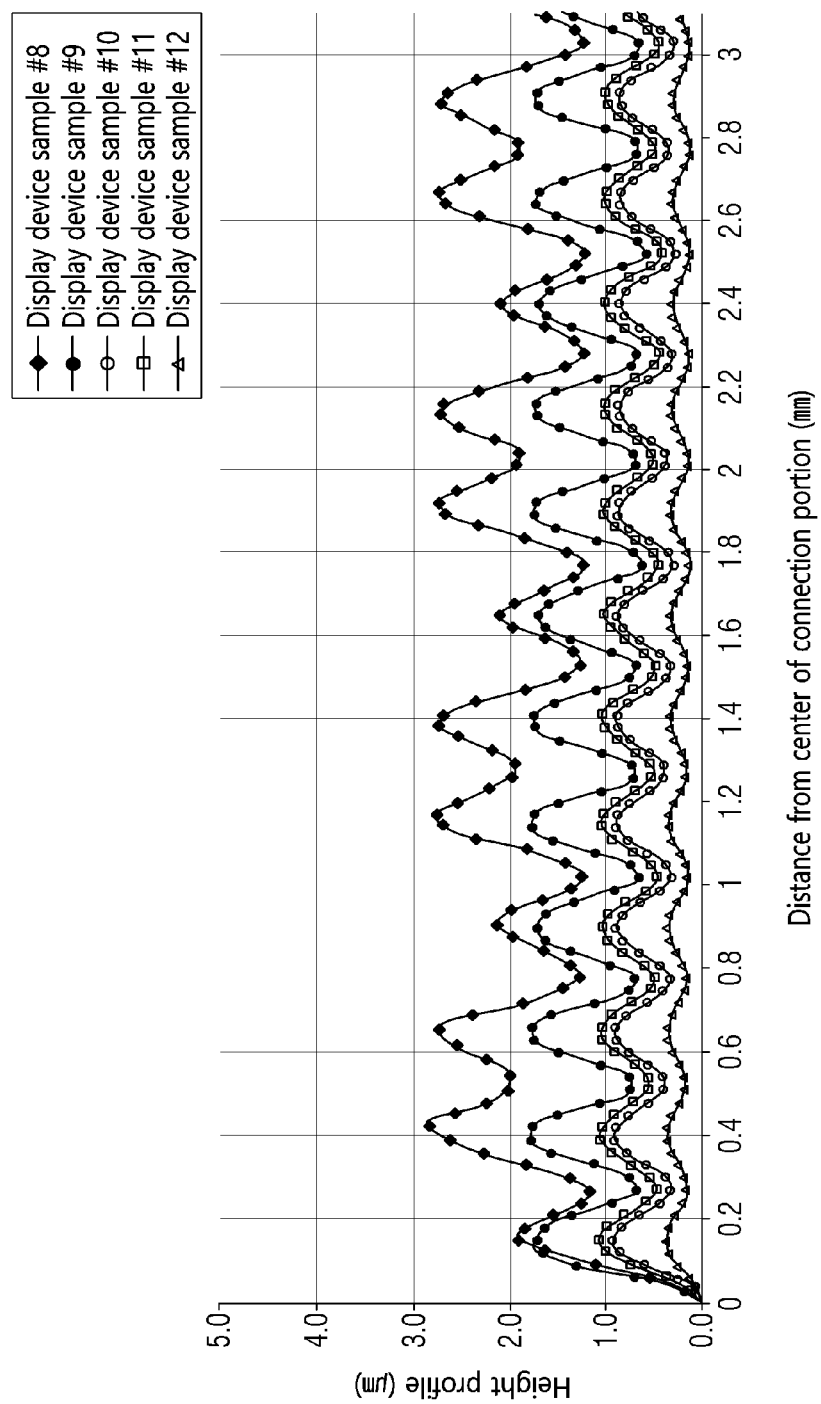
FIG. 15 is a graph showing a height profile according to a distance from the center of a connection portion of a metal plate in each of the display device samples.

Each of the display device samples #8 to #12 was stored under conditions of a temperature 60 degrees Celsius (° C.) and a humidity of 93 percentages (%) for 24 hours in a folded state, and then a height profile was measured from the center of the connection portion of the metal plate to the edge thereof using a 3D profile meter. Results thereof are shown in FIG. 15. FIG. 15 is a graph showing a height profile according to a distance from the center of the connection portion of the metal plate in each of the display device samples.

Referring to FIG. 15, in the display device sample #8 in which the first and second barrier members 420 and 250 are disposed on the metal plate 200, the step between the low point and high point of the height profile of the display device in an area overlapping the connection portion 230 of the metal plate 200 was about 1 µm or more. That is, the shape of the lattice pattern of the connection portion 230 of the metal plate 200 causes the deformation of the display module disposed on the metal plate 200, and thus the display module is uneven. Accordingly, when the step between the low point and high point in the folding area FA overlapping the connection portion 230 of the metal plate 200 is about 1 µm or more, the step may be visually recognized by the user.

Further, even in the display device sample #9 in which only the first barrier member 420 is disposed on the metal plate 200, the step between the low point and high point of the height profile of the display device in an area overlapping the connection portion 230 of the metal plate 200 was also about 1 µm or more, the shape of the lattice pattern was visually recognized to some degree.

On the other hand, in the same structure as the display device sample #9, in the display device sample #10 in which the modulus of the first barrier member 420 was increased to about 10 GPa, the display device sample #11 in which the thickness of the first barrier member 420 was increased to about 35 µm, and the display device sample #12 in which the thickness of the first coupling member 510 was increased to about 16 µm, the step between the low point and high point of the height profile of the display device in an area overlapping the connection portion 230 of the metal plate 200 was about 0.5 µm or less. That is, the step according to the deformation of the display module due to the shape of the lattice pattern of the connection portion was not visually recognized by the user.

Consequently, when the thickness and modulus of the first barrier member 420 are increased and the thickness of the first coupling member 510 is increased, the step according to the deformation of the display module due to the shape of the lattice pattern of the connection portion may be decreased to prevent the step from being visually recognized by the user.

According to a display device of embodiments, a cushion member may be disposed on a metal plate, thereby preventing impact resistance.

Further, according to a display device of embodiments, a first barrier member having a large modulus may be disposed, thereby preventing the lattice pattern shape of a connection portion of the metal plate from being viewed.

Further, according to a display device of embodiments, the thickness of each of a first coupling member and a second coupling member disposed on and under the first barrier member may be set in a predetermined range, thereby improving impact resistance.

Further, according to a display device of embodiments, the first coupling member disposed between the first barrier member and the metal plate may be formed not to overlap the connection portion of the metal plate, thereby preventing a display module from sagging in an area overlapping the connection portion of the metal plate.

Although the preferred embodiments of the disclosure have been disclosed for illustrative purposes, those skilled in the art will appreciate that various modifications, additions and substitutions are possible, without departing from the scope and spirit of the invention as disclosed in the accompanying claims.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device, comprising:
   a display panel including a rear surface and a front surface, the front surface being provided with a display surface and including a folding axis extending in a first direction;
   a first barrier member disposed on the rear surface of the display panel;
   a first coupling member disposed on a rear surface of the first barrier member; and
   a metal plate disposed on a rear surface of the first coupling member and including a first plate portion and a second plate portion which are arranged in a second direction crossing the first direction and a connection portion connecting the first plate portion and the second plate portion,
   wherein the first coupling member does not overlap the connection portion in a plan view, and
   wherein in a state where the display panel is folded, the connection portion of the metal plate contacts the first barrier member.

2. The display device of claim 1,
   wherein the first barrier member has the modulus of about 1 GPa to about 10 GPa.

3. The display device of claim 2,
wherein the first barrier member has a thickness of about 25 micrometers ($\mu m$) to about 80 $\mu m$.

4. The display device of claim 3,
wherein the first barrier member includes at least one selected from polyimide, polyacrylate, polymethyl methacrylate, polycarbonate, polyethylene terephthalate, polyethylene naphthalate, polyether sulfone, and a cycloolefin copolymer.

5. The display device of claim 1,
wherein the first barrier member has the modulus of about 10 GPa to about 300 GPa.

6. The display device of claim 5,
wherein the first barrier member has a thickness of about 10 $\mu m$ to about 50 $\mu m$.

7. The display device of claim 6,
wherein the first barrier member includes at least one selected from steel used stainless (SUS), invar, aluminum, iron, chromium, carbon, nickel, silicon, manganese, and molybdenum.

8. The display device of claim 1,
wherein the first coupling member includes a first coupling portion overlapping the first plate portion and a second coupling portion spaced apart from the first coupling portion and overlapping the second plate portion in the plan view.

9. The display device of claim 8,
wherein the first coupling portion and the second coupling portion are spaced apart from each other by a first spacing interval, and a width of the first spacing interval is equal to or greater than a width of the connection portion in the second direction.

10. The display device of claim 8, further comprising:
a second coupling member disposed between the display panel and the first barrier member,
wherein a sum of a thickness of the first coupling member and a thickness of the second coupling member is greater than about 1 $\mu m$ and equal to or less than about 80 $\mu m$.

11. The display device of claim 10,
wherein the thickness of the second coupling member is about 1 $\mu m$ and about 50 $\mu m$.

12. A display device, comprising:
a display panel including a rear surface and a front surface, the front surface being provided with a display surface and including a folding axis extending in a first direction;
a first barrier member disposed on the rear surface of the display panel;
a first coupling member including a first coupling portion and a second coupling portion disposed on a rear surface of the first barrier member; and
a metal plate disposed on a rear surface of the first coupling member and including a first plate portion and a second plate portion which are arranged in a second direction crossing the first direction and a connection portion connecting the first plate portion and the second plate portion,
a third coupling member disposed on a rear surface of the metal plate;
a second barrier member disposed on a rear surface of the third coupling member;
a fourth coupling member disposed on a rear surface of the second barrier member; and
a heat dissipation member disposed on a rear surface of the fourth coupling member,
wherein the first coupling member does not overlap the connection portion in a plan view.

13. The display device of claim 12,
wherein the second barrier member overlaps the first plate portion, the second plate portion, and the connection portion in the plan view.

14. The display device of claim 12,
wherein the heat dissipation member includes a first heat dissipation portion overlapping the first plate portion and a second heat dissipation portion spaced apart from the first heat dissipation portion and overlapping the second plate portion in the plan view.

15. The display device of claim 14,
wherein a first spacing interval between the first heat dissipation portion and the second heat dissipation portion overlaps the connection portion in the plan view.

16. The display device of claim 15,
wherein the fourth coupling member includes a third coupling portion overlapping the first plate portion and a fourth coupling portion spaced apart from the third coupling portion and overlapping the second plate portion in the plan view,
the third coupling portion and the fourth coupling portion are spaced apart from each other by a second spacing interval, and
the second spacing interval is equal to or greater than a width of the connection portion.

17. The display device of claim 16, further comprising:
a fifth coupling member disposed on a rear surface of the heat dissipation member; and
a cushion member disposed on a rear surface of the fifth coupling member,
wherein the cushion member includes a first cushion portion overlapping the first plate portion and a second cushion portion spaced apart from the first cushion portion and overlapping the second plate portion in the plan view,
the first cushion portion and the second cushion portion are spaced apart from each other by a third spacing interval, and
the third spacing interval overlaps the connection portion in the plan view.

18. An electronic device, comprising:
a display panel including a rear surface and a front surface, the front surface being provided with a display surface and including a folding axis extending in a first direction;
a first barrier member disposed on the rear surface of the display panel;
a first coupling member disposed on a rear surface of the first barrier member;
a metal plate disposed on a rear surface of the first coupling member and including a first plate portion and a second plate portion which are arranged in a second direction crossing the first direction and a connection portion connecting the first plate portion and the second plate portion;
a polarization member disposed on the front surface of the display panel;
a cover window disposed on the polarization member; and
a cover window protection layer disposed on the cover window,
wherein the first coupling member does not overlap the connection portion in a plan view, and wherein in a state where the display panel is folded, the connection portion of the metal plate contacts the first barrier member.

19. The electronic device of claim 18, wherein the first barrier member has the modulus of about 1 GPa to about 300 GPa.

20. The electronic device of claim 18, wherein the first coupling member includes a first coupling portion overlapping the first plate portion and a second coupling portion spaced apart from the first coupling portion and overlapping the second plate portion in the plan view, and wherein the first coupling portion and the second coupling portion are spaced apart from each other by a first spacing interval, and a width of the first spacing interval is equal to or greater than a width of the connection portion in the second direction.

* * * * *